United States Patent
Pioro-Ladriere et al.

(10) Patent No.: US 10,929,769 B2
(45) Date of Patent: Feb. 23, 2021

(54) ELECTRONIC CIRCUIT FOR CONTROL OR COUPLING OF SINGLE CHARGES OR SPINS AND METHODS THEREFOR

(71) Applicants: SOCPRA SCIENCES ET GÉNIE S.E.C., Sherbrooke (CA); NATIONAL TECHNOLOGY & ENGINEERING SOLUTIONS OF SANDIA, LLC., Albuquerque, NM (US)

(72) Inventors: Michel Pioro-Ladriere, Sherbrooke (CA); Sophie Rochette, Sherbrooke (CA); John King Gamble, Albuquerque, NM (US); Gregory A Ten Eyck, Albuquerque, NM (US); Martin Rudolph, Albuquerque, NM (US); Malcolm Carroll, Albuquerque, NM (US)

(73) Assignees: SOCPRA SCIENCES ET GÉNIE S.E.C., Sherbrooke (CA); NATIONAL TECHNOLOGY & ENGINEERING SOLUTIONS OF SANDIA, LLC., Albuquerque, NM (US)

( * ) Notice: Subject to any disclaimer, the term of this patent is extended or adjusted under 35 U.S.C. 154(b) by 19 days.

(21) Appl. No.: 16/094,176

(22) PCT Filed: Jun. 8, 2017

(86) PCT No.: PCT/CA2017/050696
§ 371 (c)(1),
(2) Date: Oct. 16, 2018

(87) PCT Pub. No.: WO2017/210790
PCT Pub. Date: Dec. 14, 2017

(65) Prior Publication Data
US 2019/0130298 A1 May 2, 2019

Related U.S. Application Data

(60) Provisional application No. 62/347,346, filed on Jun. 8, 2016.

(51) Int. Cl.
*G06N 10/00* (2019.01)
*H01L 29/66* (2006.01)
(Continued)

(52) U.S. Cl.
CPC ........... *G06N 10/00* (2019.01); *H01L 29/122* (2013.01); *H01L 29/66439* (2013.01); *H01L 29/66977* (2013.01); *H01L 31/035236* (2013.01)

(58) Field of Classification Search
CPC ..... H01L 29/122–127; H01L 29/66977; H01L 29/66439–66469
See application file for complete search history.

(56) References Cited

U.S. PATENT DOCUMENTS

| 5,294,807 A | 3/1994 | Ugajin et al. |
| 5,384,469 A | 1/1995 | Choi |

(Continued)

FOREIGN PATENT DOCUMENTS

| CA | 2438871 C | 1/2011 |
| EP | 1860600 A1 | 11/2007 |

(Continued)

OTHER PUBLICATIONS

European application No. 17809503 extended search report dated Feb. 10, 2020.

(Continued)

*Primary Examiner* — Amar Movva
(74) *Attorney, Agent, or Firm* — Anglehart et al.

(57) ABSTRACT

A quantum dot structure having a split-gate geometry is provided. The quantum dot is configured for incorporation (Continued)

into a quantum dot array of a quantum processing unit. A gap between a reservoir accumulation gate and a quantum dot accumulation gate provides a tunnel barrier between an electric charge reservoir and a quantum dot well. An electrical potential applied to the gates defines a tunnel barrier height, width and charge tunneling rate between the well and the reservoir without relying on any barrier gate to control the charge tunneling rate.

19 Claims, 21 Drawing Sheets

(51) Int. Cl.
*H01L 29/12* (2006.01)
*H01L 31/0352* (2006.01)

(56) References Cited

U.S. PATENT DOCUMENTS

| | | |
|---|---|---|
| 5,447,873 A | 9/1995 | Randall et al. |
| 5,783,840 A | 7/1998 | Randall et al. |
| 5,793,091 A | 8/1998 | Devoe |
| 5,889,288 A | 3/1999 | Futatsugi |
| 6,323,504 B1 | 11/2001 | Shin et al. |
| 6,472,681 B1 | 10/2002 | Kane |
| 6,597,010 B2 | 7/2003 | Eriksson et al. |
| 6,635,898 B2 | 10/2003 | Williams et al. |
| 7,061,008 B2 | 6/2006 | Clark et al. |
| 7,135,697 B2 | 11/2006 | Friesen et al. |
| 7,176,066 B2 | 2/2007 | Brenner et al. |
| 7,411,187 B2 | 8/2008 | Monroe et al. |
| 7,479,652 B2 | 1/2009 | Greentree et al. |
| 7,655,850 B1 | 2/2010 | Ahn |
| 7,781,754 B2 | 8/2010 | Loss et al. |
| 7,830,695 B1 | 11/2010 | Moon |
| 7,966,549 B2 | 6/2011 | Hollenberg et al. |
| 8,008,649 B2 | 8/2011 | Register, II et al. |
| 8,148,715 B2 | 4/2012 | Hollenberg et al. |
| 8,164,082 B2 | 4/2012 | Friesen |
| 8,222,629 B2 | 7/2012 | Pioro-Ladriere et al. |
| 8,227,300 B2 | 7/2012 | He et al. |
| 8,507,894 B2 | 8/2013 | Morello et al. |
| 8,816,325 B2 | 8/2014 | Schenkel et al. |
| 2002/0179897 A1 | 12/2002 | Eriksson et al. |
| 2005/0167772 A1 | 8/2005 | Stoneham et al. |
| 2015/0279981 A1 | 10/2015 | Eriksson et al. |

FOREIGN PATENT DOCUMENTS

| | | |
|---|---|---|
| EP | 2075745 A1 | 7/2009 |
| EP | 2560133 A1 | 2/2013 |
| EP | 2562694 A1 | 2/2013 |
| WO | WO 2005/020139 A1 | 3/2005 |
| WO | WO 2015/184484 A1 | 12/2015 |

OTHER PUBLICATIONS

Tagliaferri M L V et al: "A compact T-shaped nanodevice for charge sensing of a tunable double quantum dot in scalable silicon technology", Physics Letters A, North-Holland Publishing Co., Amsterdam, NL, vol. 380, No. 11, Jan. 21, 2016 (Jan. 21, 2016), pp. 1205-1209,XP029412472, ISSN:0375-9601, DOI: 10.1016/J.PHYSLETA.2016.01.031.
PCT/CA2017/050696 IPRP.
PCT/CA2017/050696 ISR.
PCT/CA2017/050696 Search strategy.

100 nm

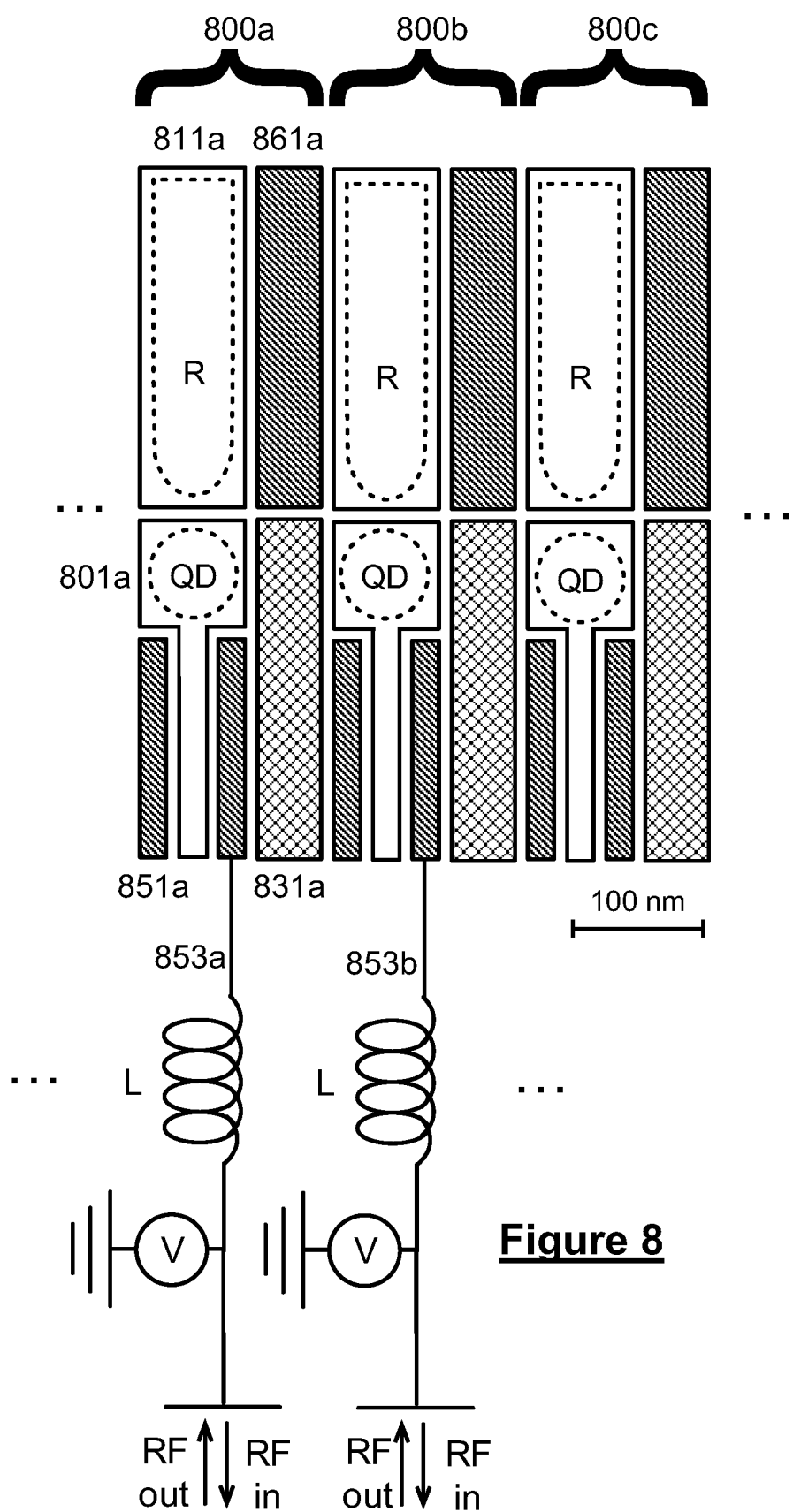

ELECTRONIC CIRCUIT FOR CONTROL OR COUPLING OF SINGLE CHARGES OR SPINS AND METHODS THEREFOR

This application claims priority to U.S. provisional patent application Ser. No. 62/347,346 filed 8 Jun. 2016.

STATEMENT REGARDING FEDERALLY-FUNDED RESEARCH

This invention was supported, in part, under Contract DE-AC04-94AL85000 between Sandia Corporation and the U.S. Department of Energy. The U.S. Government has certain rights in this invention.

TECHNICAL FIELD

This invention relates to quantum computing, and in particular to a micro-electronic circuit for control or coupling of single charges or spins, quantum computing systems incorporating the circuit and methods therefor.

BACKGROUND

In quantum computing, there is a need for means for controlling and coupling of single charges and spins.

In accordance with one approach for the encoding and manipulation of quantum information, what is required is confinement of single electrons. The spin degree of freedom of the electron provides a natural two-level quantum system to encode the information in the form of a quantum bit (qubit), the fundamental unit of quantum information. In this case, the qubit includes a spin up state (state 0), a spin down state (state 1), and interim states that are a superposition of both the spin up and spin down states at the same time. The states of a qubit can be represented as points on the surface of a sphere (the Bloch sphere), as depicted in FIG. 1.

Of the variety of approaches to confining electron spins, confinement of a single electron spin in solid-state is sought with the goal of integration with solid-state (micro-) electronics. Quantum Dots (QDs) provide such confinement by using, in some implementations, electric control gates on a semiconductor substrate. Frequently used substrates include silicon (Si), aluminum gallium arsenide heterostructures (AlGaAs/GaAs), silicon germanium heterostructures (Si/SiGe), and indium arsenide (InAs).

Quantum Computation with Spin Qubits in Quantum Dots

Quantum computation is generally represented as a sequence of operations requiring precise functionalities from a physical circuit. A typical sequence is represented in FIG. 2 for a circuit constituted of single electron spin qubits with quantum dots.

What is required first is an array of quantum dots (QDs) and, in some implementations, their reservoir (R), like in FIG. 2a. Then each quantum dot is initialized with one electron from its reservoir, as illustrated in FIG. 2b. A means for detecting the charge occupation of the QD is thus necessary. This is usually achieved by counting electrons with proximal charge sensors, e.g. quantum point contacts, single electron transistors (SET), or capacitively coupled electrodes.

The next requirement is the ability to initialize all the qubits to a known state. It is performed in some implementations by applying an external magnetic field to polarize the spins, as depicted in FIG. 2c.

Once spins are initialized, the actual computation can begin. A computation can be executed by an adequate combination of single spin rotations (R) and exchange coupling between neighboring spins (J) (FIG. 2f). Arbitrary single spin rotations are generally realized with the application of electron spin resonance (ESR) pulses (FIG. 2d). Being a very short range interaction, the exchange coupling is turned on and off by modulating the tunnel barrier between adjacent quantum dots (FIG. 2e).

Finally, the ability to readout some or preferably all of the qubits is necessary to determine the result of a quantum calculation. In some implementations, this can be obtained by spin dependant tunneling to the reservoir, where the electron occupation in the dot remains one if the spin is up, and becomes zero if the spin is down. The change in occupation is detected by charge sensing (FIG. 2g).

In some attempts, control of coherent electron spin states in quantum dots is limited by short coherence times (very short stability of the superposition state). In this sense qubits are very fragile entities. The challenge is to protect the state of a qubit from the surrounding environment long enough to achieve a sufficient number of logic operations on the quantum state for useful calculations. In order to achieve this feat, the surrounding environment has to be controlled to the fullest extent possible. It has been demonstrated that isotopically enriched $^{28}$Si substrates offers sufficiently long coherence times for robust quantum computing with spin qubits in quantum dots.

Quantum Dots

Many architectures for quantum dots have been proposed. Prior art comes in two forms: arena designs and local accumulation designs. Both forms have been successful in demonstrating several functionalities necessary to quantum computation.

Arena designs rely on electrostatic gates to deplete regions of a two-dimensional electron gas (2DEG), formed by an heterostructure and/or by a global accumulation gate. FIG. 3A is a typical implementation published in the literature. The electrostatic gates (dashed structures) define two quantum dots, QD1 and QD2, tunnel coupled to each other and to reservoirs R1 and R2. A nearby single electron transistor (SET) formed by reservoir R3, QD3 and reservoir R4 is used as a charge sensor of the Double-Quantum-Dot (DQD). Barrier gates 341, 342 and 343 control the tunnel barriers between the reservoirs and the dots, represented by the double arrows. Barrier gates 342 and 331 control the tunnel barrier between the dots, also represented by arrows. Confinement gates 351 to 354 define the size of quantum dots. Plunger gates 352 and 353 set QD1 and QD2 charge states. Gate 371 sets the tunnel barriers and the charge state of the SET. The region labeled 2DEG represents electrons not confined by the gates. The scale bar indicates typical structure dimension in GaAs devices.

FIG. 3B shows a cross section of the arena device in FIG. 3A, following a section along the points A and B in FIG. 3A. The 2DEG is formed in the quantum well layer 393 of the heterostructure 392. The depletion gates, such as 371, 351, and 354, deplete regions of the 2DEG to form the quantum dots QD3, QD1 and QD2. FIG. 3C shows a cross section of a device employing a global top gate (395) to create the 2DEG. The depletion gate layout is similar to the one of the device in FIG. 3A. A dielectric layer 394 isolates the depletion gates such as 371, 351, and 354, from the global top gate. Layer 391 is the gate oxide that isolates the 2DEG from the gates.

In local accumulation designs, dots and/or reservoirs can be formed directly by local accumulation gates instead of a combination of a global accumulation gate and electrostatic gate areas. Additional gates increase the confinement of accumulated regions and control the tunnel barriers. For example, in the article by Teck Seng Koh, John King Gamble, Mark Friesen, M. A. Eriksson, and S. N. Coppersmith titled Pulse-Gated Quantum-Dot Hybrid Qubit published in Physics Review Letters, PRL 109, 250503 (2012), there is disclosed a device geometry for a top-gated Si/SiGe heterostructure as illustrated in FIG. 4A. The Koh et al. article is also related to US patent application publication 2015/0279981 published on Oct. 1, 2015. The quantum dot well is provided using an accumulation gate, while the reservoir is provided using a depletion mode tunnel barrier gate and confinement in the well is enhanced using various depletion mode gates. FIG. 4B is a further state of the art implementation published in the literature. Two quantum dots, QD1 and QD2, are connected in series to reservoir R2. A proximal single electron transistor formed by reservoir R3, QD3 and reservoir R4 is used as a charge sensor of the double quantum dot DQD. The quantum dots and reservoirs are defined by accumulating electrons under electrostatic gates 401, 402, 412, and 421. Gate 451 ensures lateral confinement of the double quantum dot. Gates 431, 442, 473, and 474 control tunnel barriers between accumulated regions. The scale bar indicates typical structure dimension in Si devices.

FIG. 4C shows a cross section of the local accumulation device in FIG. 4B, following a section along the points A and B in FIG. 4B. While it is not apparent in FIG. 4A for clarity, the different gates are stacked one on the other as depicted in FIG. 4C. A thin oxide (not shown) covers each gate to insulate it from the others. Gates 401, 402, 412 and 421 accumulate locally the QDs and reservoirs, while gate 451 laterally confines QD1 and QD2. Gate 431 control the tunnel barrier between QD1 and QD2, and gate 442 controls the tunnel barrier between QD2 and R2.

SUMMARY

The transistor is the basis of information technology, the elementary unit of supercomputers predicting weather and the basis of portable computing providing access to knowledge to the whole world. The efficiency of transistors to process information resides in their integration by the millions into integrated circuits enabled by Complementary Metal-Oxide-Semiconductor (CMOS) technology, a class of integrated circuits. CMOS technology has enabled the era of information technology. The present invention facilitates a second information technology revolution using CMOS, by simplifying information processing in a quantum computer. Quantum computing seeks to exploit the properties unique to "the world of the very small" to solve complex problems. But the full potential of quantum computers has not been yet imagined.

Spin qubits in quantum dots are a promising platform for quantum information processing. The present invention allows to simplify the implementation and control of spin qubits in a scalable fashion using CMOS compatible technology, thus harnessing the full potential of the semiconductor industry for large scale integration and manufacturing.

It has been discovered that tunneling control between reservoirs and quantum dots can be simplified both in terms of wafer level fabrication and in terms of methods of control.

A quantum dot architecture having a split accumulation gate geometry is provided. The architecture includes a reservoir gate, a quantum dot gate, and a spatial gap between the two gates. The gates are placed on top of a semiconductor substrate, with or without an intermediate insulating or oxide layer. The reservoir gate is used to accumulate electrons in the substrate underneath, forming a reservoir. The electrons can originate from doped regions in the substrate, far from the quantum dot. The quantum dot gate is used to attract underneath one or more electrons from the reservoir in a controlled fashion, forming a quantum dot with a tunable discrete number of electrons. The gap between the two gates creates a natural tunnel barrier between the reservoir and the quantum dot. The split gate geometry allows tuning of this tunnel barrier, and thus control of the electron tunneling rate between the dot and the reservoir, with no need for an additional dedicated barrier gate, such as 442 in FIGS. 4B and 4C.

Various configurations of the split accumulation gate geometry are provided for incorporation into a quantum dot array. Such an array can be used to form a quantum processing unit. Various embodiments of quantum processing units based on the split gate geometry are also provided. Examples are provided on how quantum computing requirements such as single qubit and two qubits control, readout, and initialization can be integrated to those quantum processing units.

BRIEF DESCRIPTION OF THE DRAWINGS

The proposed solution will be better understood by way of the following detailed description of embodiments of the invention with reference to the appended drawings, in which:

FIG. 8 is a schematic diagram illustrating an implementation of capacitive charge sensing in the split gate quantum dot array structure illustrated in FIG. 6B;

wherein similar features bear similar labels throughout the drawings. While the layer sequence described is of significance, reference to "top", "bottom", "left" and "right" qualifiers in the present specification is made solely with reference to the orientation of the drawings as presented in the application and do not imply any absolute spatial orientation

DETAILED DESCRIPTION

In some embodiments, there is provided a method of forming a quantum dot and a reservoir and controlling the rate of transfer of charges, namely electrons or holes, between them in a semiconductor device for use in a quantum computer. The method can comprise using a split gate geometry for the accumulation gates of the quantum semiconductor device, where a distinct gate is used to form a quantum dot, and another distinct gate is used to form the reservoir for the quantum dot, with a spatial gap between the two gates.

Figure 5A:
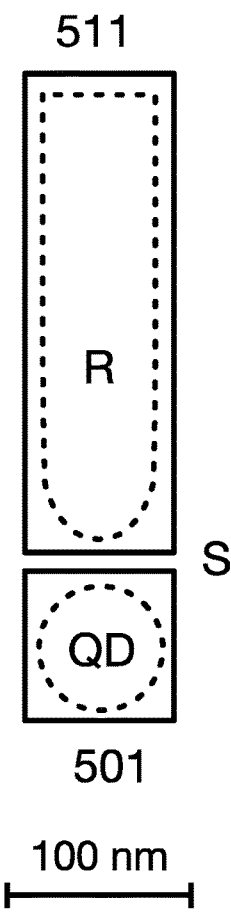
FIG. 5A is a schematic diagram illustrating an embodiment of the split gate structure.
Figure 5B:
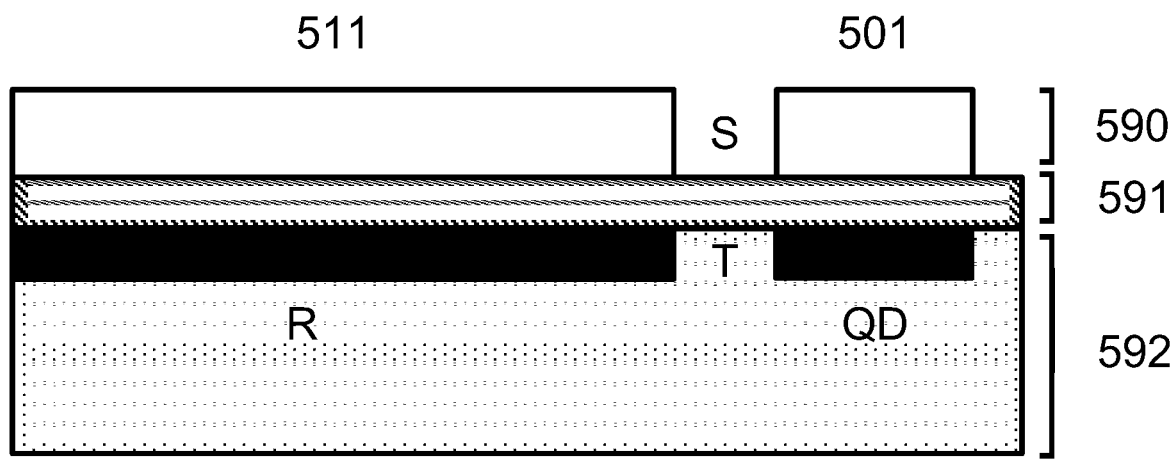
FIG. 5B is a schematic diagram illustrating a cross-sectional view of the embodiment of the proposed solution of FIG. 5A.

The split gate geometry is illustrated in FIG. 5A. A positive voltage applied on gate 511 defines the reservoir R in the semiconductor substrate underneath. A positive voltage applied on gate 501 defines the quantum dot QD in the semiconductor substrate underneath. The spatial gap between the two gates is labeled S, and it defines a tunnel barrier T in the semiconductor substrate underneath. Scale bar indicates typical dimensions in a silicon device. FIG. 5B shows a schematic cross-sectional view of the quantum semiconductor device including a split gate geometry and the regions it defines in a semiconductor substrate. Region 590 is the accumulation gate layer, with 501 the QD accumulation gate, 511 the reservoir accumulation gate, and S the spatial gap. Region 591 is the dielectric layer isolating the gates from the substrate (592). The reservoir R, the quantum dot QD, and the tunnel barrier T are formed at the interface between regions 591 and 592.

Figure 5C:
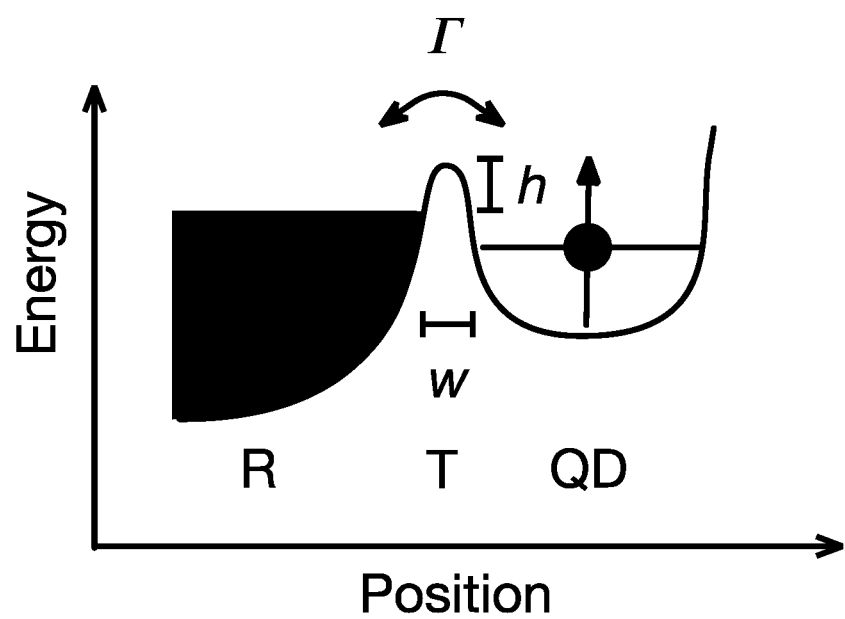
FIG. 5C is a schematic diagram illustrating the energy position of the conduction band minima in the semiconductor substrate, as defined by the electric potential of the gates and the spatial gap composing the embodiment of the proposed solution of FIG. 5A.

FIG. 5C shows the energy of the conduction band following the axis reservoir-dot in the device illustrated in FIGS. 5A and 5B when positive voltages are applied on gates 501 and 511. The reservoir R is filled with electrons occupying a continuum of energies, and the quantum dot QD presents discrete energy levels, indicated by horizontal lines. Between the dot and the reservoir, the tunnel barrier T sets the tunneling rate Γ of electrons. The barrier is often characterized by its height h and width w. Tuning of the barrier involves modifying h and/or w and can affect Γ.

The method for controlling the rate of transfer of electrons between an electron reservoir and a quantum dot in a semiconductor device presenting a split gate geometry as described above can comprise adjusting the potential of the reservoir accumulation gate to adjust the transfer rate of electrons between the reservoir and its corresponding dot and compensating accordingly the voltage on the dot accumulation gate to maintain the dot occupation number constant. The split gate geometry, using only two gates and a spatial gap between them, can perform reservoir formation, quantum dot formation, and tunnel rate control. With prior art implementations of local accumulation devices, those three functionalities are performed with accumulation gates for reservoirs and quantum dots formation, and one or more barrier gates for tunnel rate control.

The invention as described could be used to simplify design and control of local accumulation quantum dots in silicon, silicon germanium heterostructures, gallium arsenide heterostructures, or any other standard semiconductor substrates.

Figure 6A:
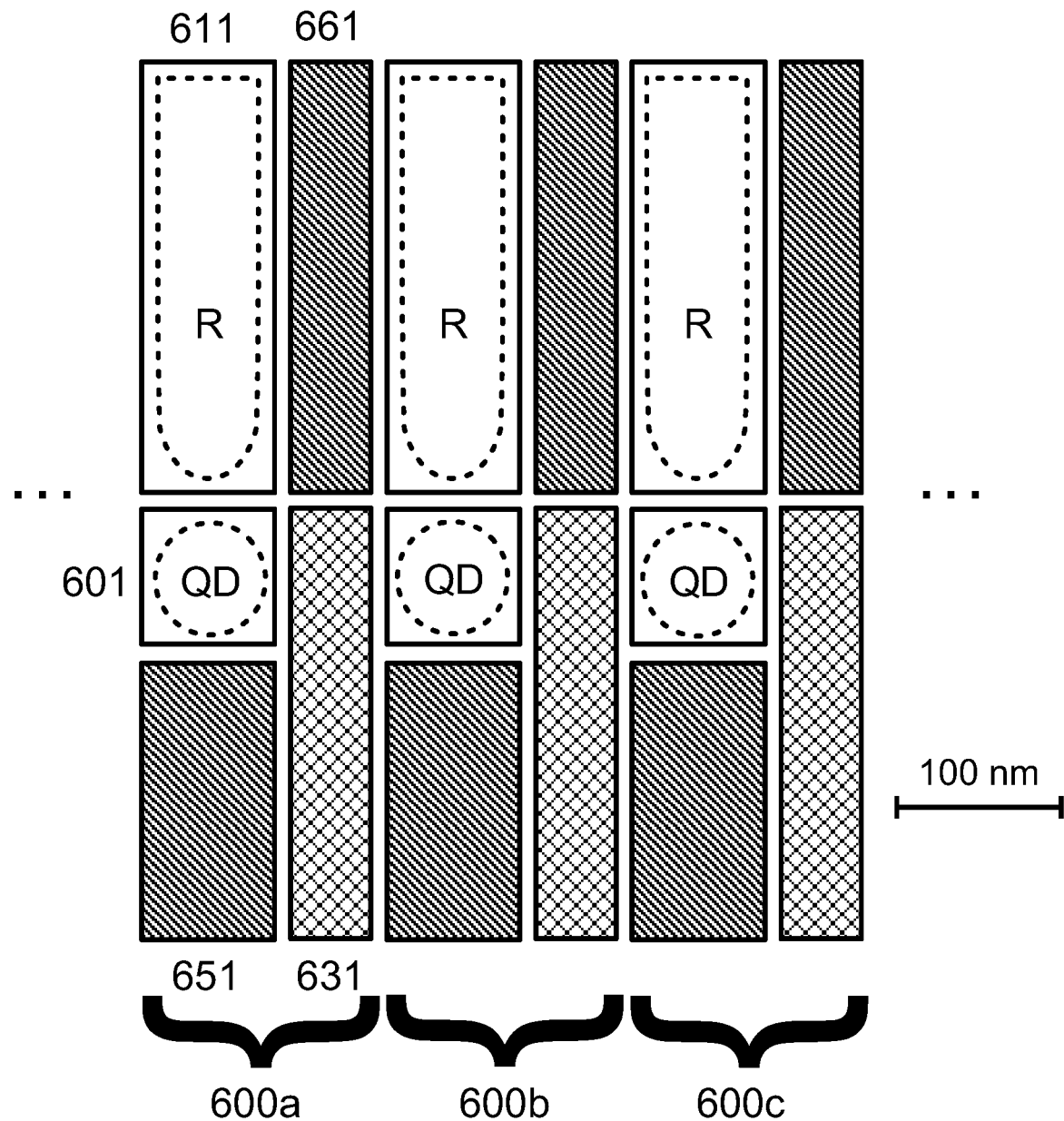
FIG. 6A is a schematic diagram illustrating a split gate quantum dot array structure in accordance with an implementation of the embodiment of the proposed solution.

FIG. 6A is an implementation of a quantum dot array using the invention. The proposed geometry illustrated in FIG. 5A can be used to form a QD array. The elementary unit 600a of the architecture illustrated in FIG. 6A, is composed of the reservoir gate 611, QD charge gate 601, spatial gap S, QD confinement gate 651, reservoir confinement gate 661 and coupling gate 631. A positive voltage applied on gates 611 and 601 will form the reservoir R and the quantum dot QD, as well as the tunnel barrier T separating them. Confinement gates 651 and 661 help confining the regions associated with the quantum dots and the reservoirs, respectively, when a negative voltage is applied to them. Modifying the voltage applied to coupling gate 631 will control the tunnel barrier between two adjacent quantum dots, which is important for two-qubit operations. This arrayed chain is illustrated as having 3 quantum dots with more on each side. The elementary unit 600a can be repeated as much as needed to provide an arrayed chain of quantum dots of any desired length. As illustrated in FIG. 6A, gates 601 influence (are connected to) the QDs from the top using 3D wafer level fabrication techniques.

Figure 1:
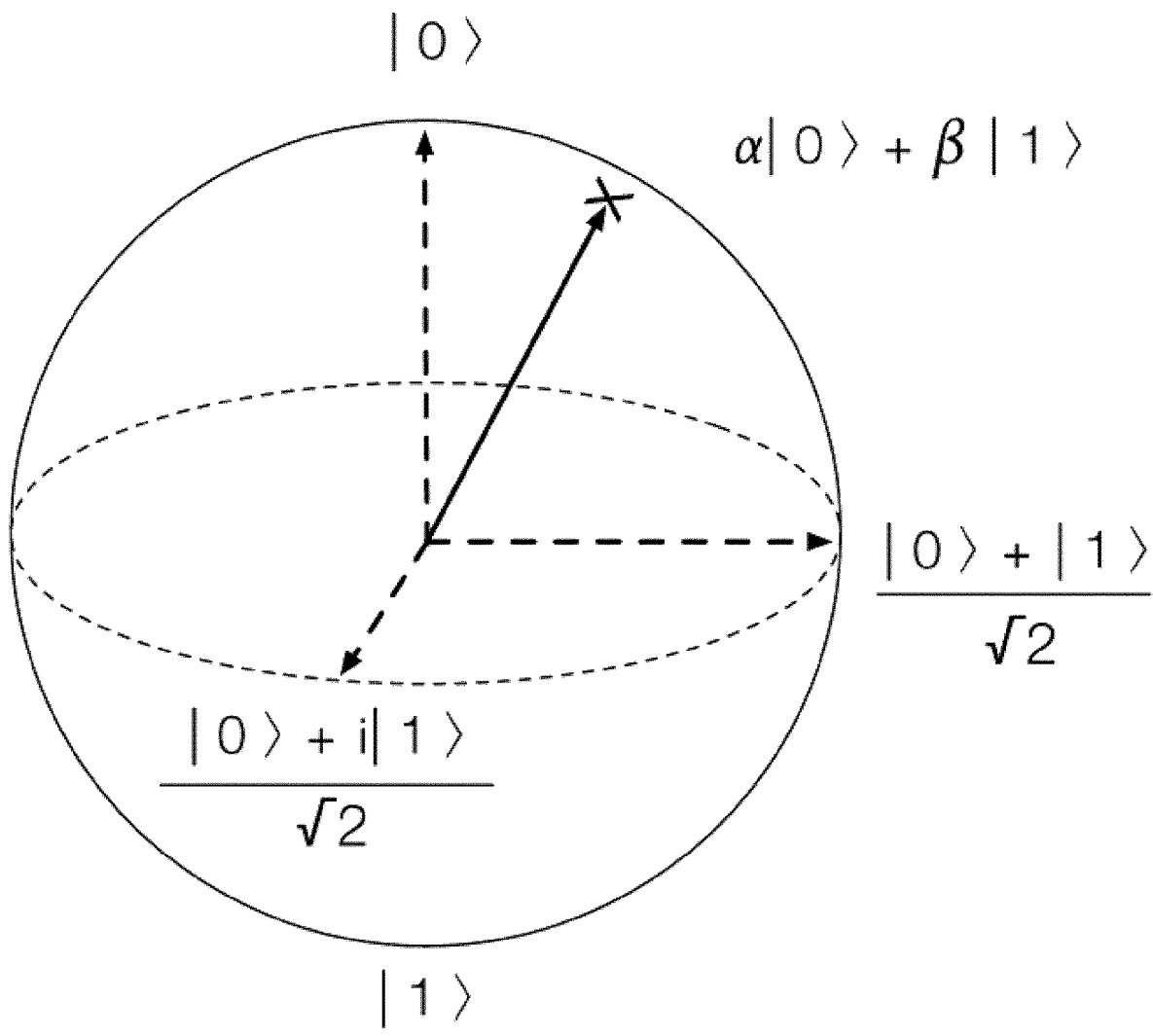
FIG. 1 is an illustration of the Bloch sphere showing the possible states of a qubit as points on its surface. The arrow pointing to a cross on the surface of the sphere represents an arbitrary superposition of the basis states 0 and 1.
Figure 2:
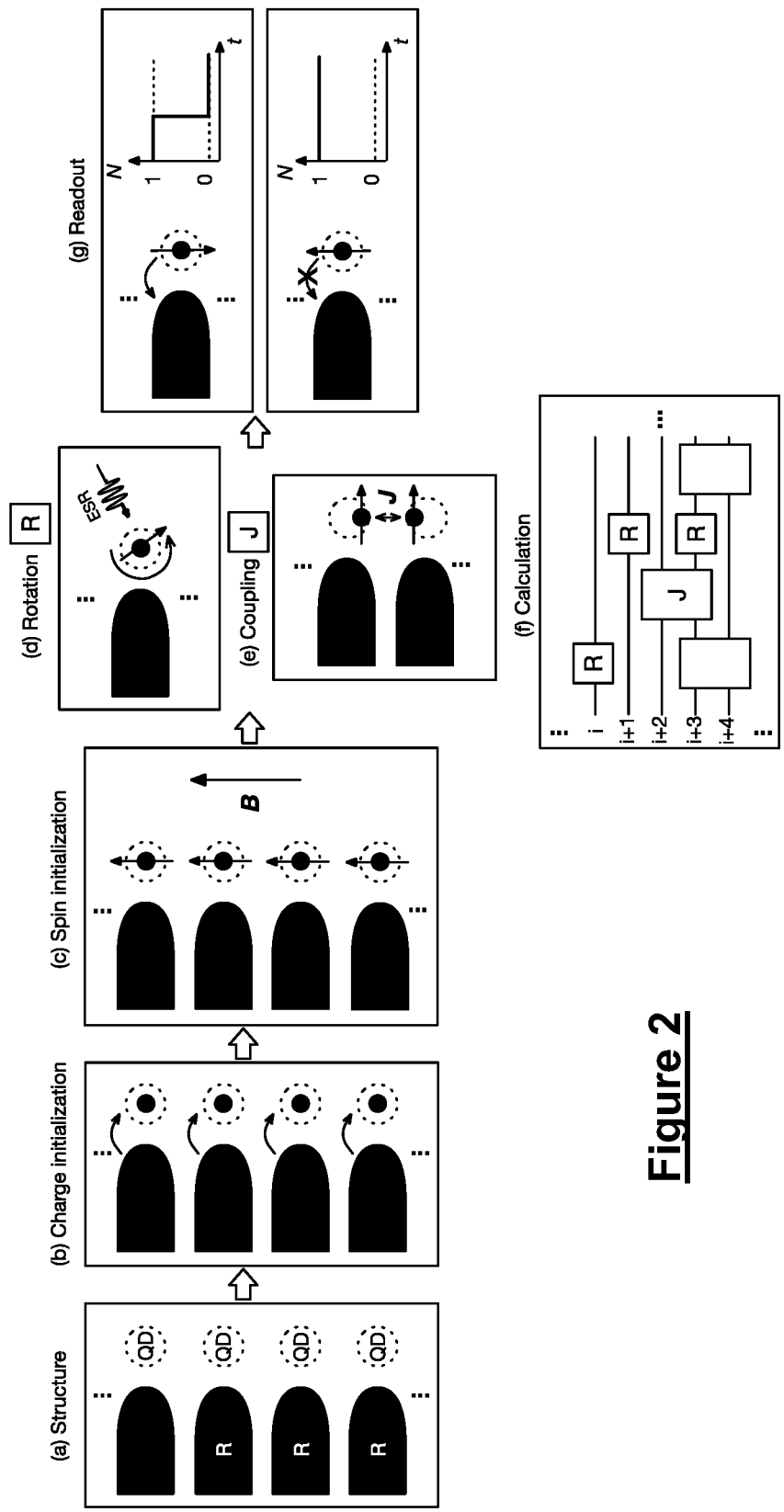
FIG. 2A is a schematic diagram illustrating a quantum dot array of a quantum processing unit before initialization in accordance with a standard sequence for quantum computation.
FIG. 2B is a schematic diagram of charge initialization of a quantum dot array of a quantum processing unit in accordance with a standard sequence for quantum computation.
FIG. 2C is a schematic diagram of spin initialization of a quantum dot array of a quantum processing unit in accordance with a standard sequence for quantum computation.
FIG. 2D is a schematic diagram illustrating electron spin rotation R of an electron trapped in a quantum dot of a quantum processing unit with an ESR pulse, in accordance with a standard sequence for quantum computation.
FIG. 2E is a schematic diagram illustrating exchange coupling J of two electron spins by exchange interaction in two adjacents quantum dots of a quantum processing unit in accordance with a standard sequence for quantum computation.
FIG. 2F is a schematic diagram illustrating a quantum computation decomposed into a specific sequence of electron spin rotations R and exchange coupling J acting on an array of qubits, represented as horizontal wires labeled i.
FIG. 2G is a schematic diagram illustrating electron spin readout using spin-dependant tunneling. The top panel corresponds to the case where the spin orientation of the electron does allow tunneling to the reservoir, and the bottom panel corresponds to the case where the spin orientation of the electron does not allow tunneling to the reservoir.
Figure 3A:
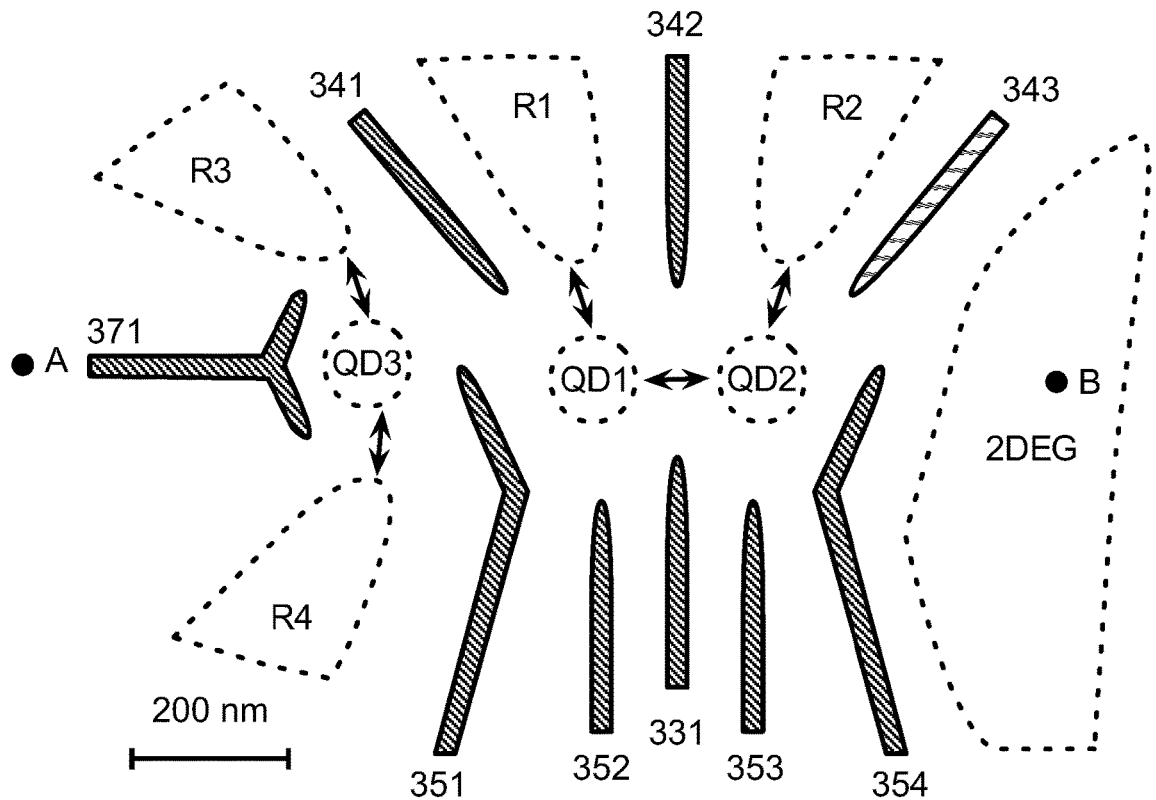
FIG. 3A is a schematic diagram showing a prior art implementation of an arena dual quantum dot.
Figure 3B:
FIG. 3B is a schematic diagram showing a cross-sectional view through the layer structure of the prior art dual quantum dot implementation shown in FIG. 3A.
Figure 3C:
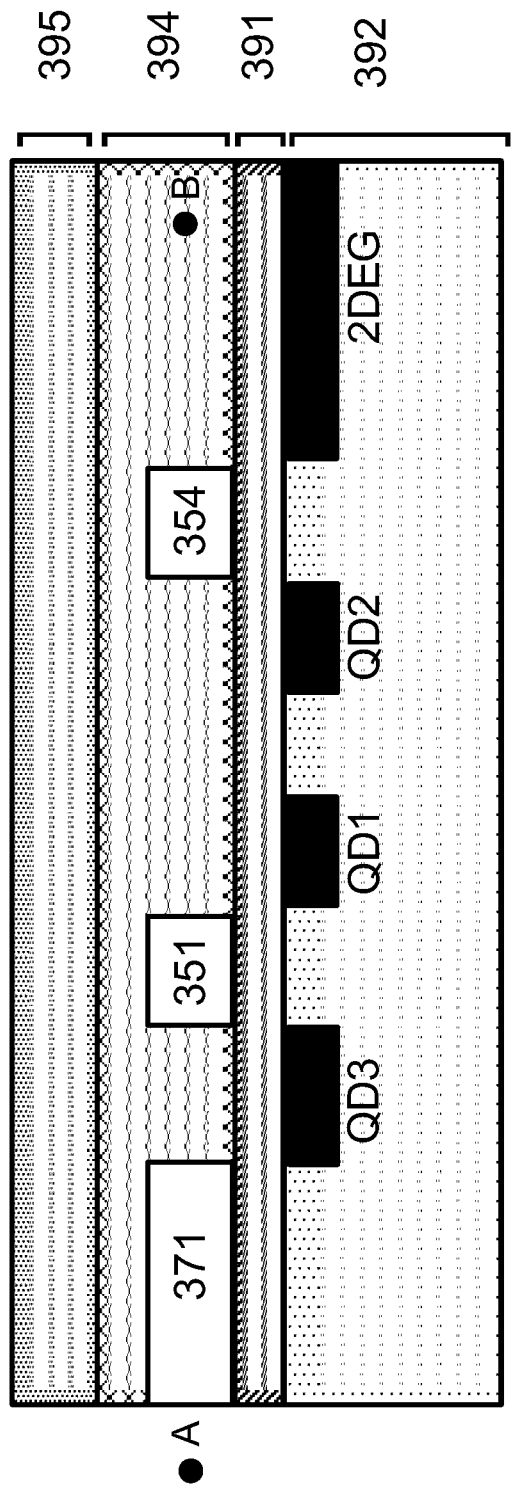
FIG. 3C is a schematic diagram showing a cross-sectional view through the layer structure of another prior art implementation of an arena design dual quantum using a global accumulation gate.
Figure 4A:
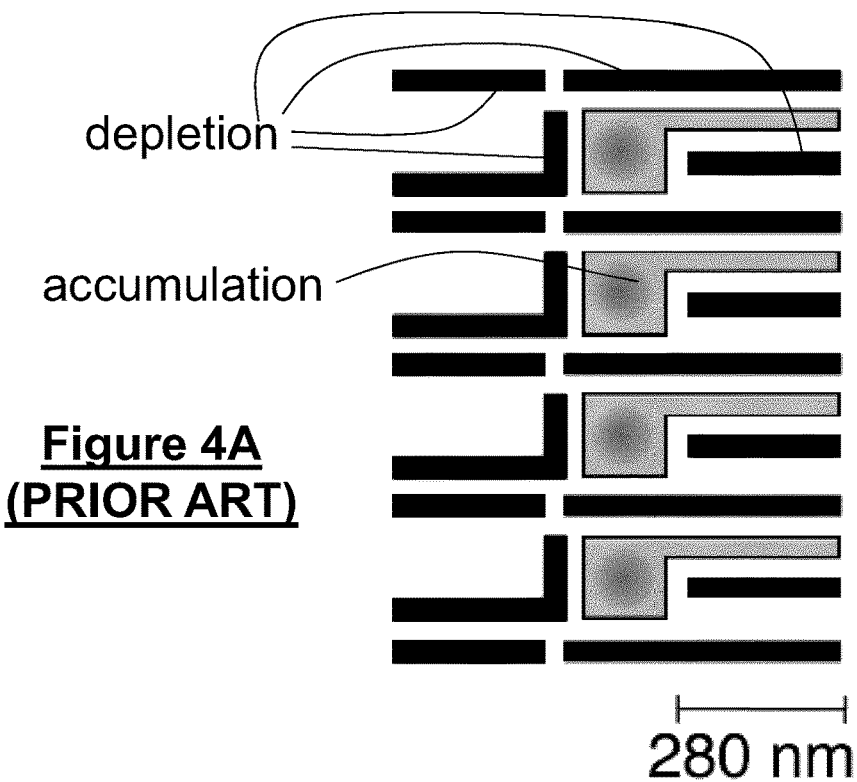
FIG. 4A is a schematic diagram of a device geometry for a top-gated Si/SiGe heterostructure in which the quantum dot well is provided using an accumulation gate, while the reservoir is provided using a depletion mode tunnel barrier gate and confinement in the well is enhanced using various depletion mode gates.
Figure 4B:
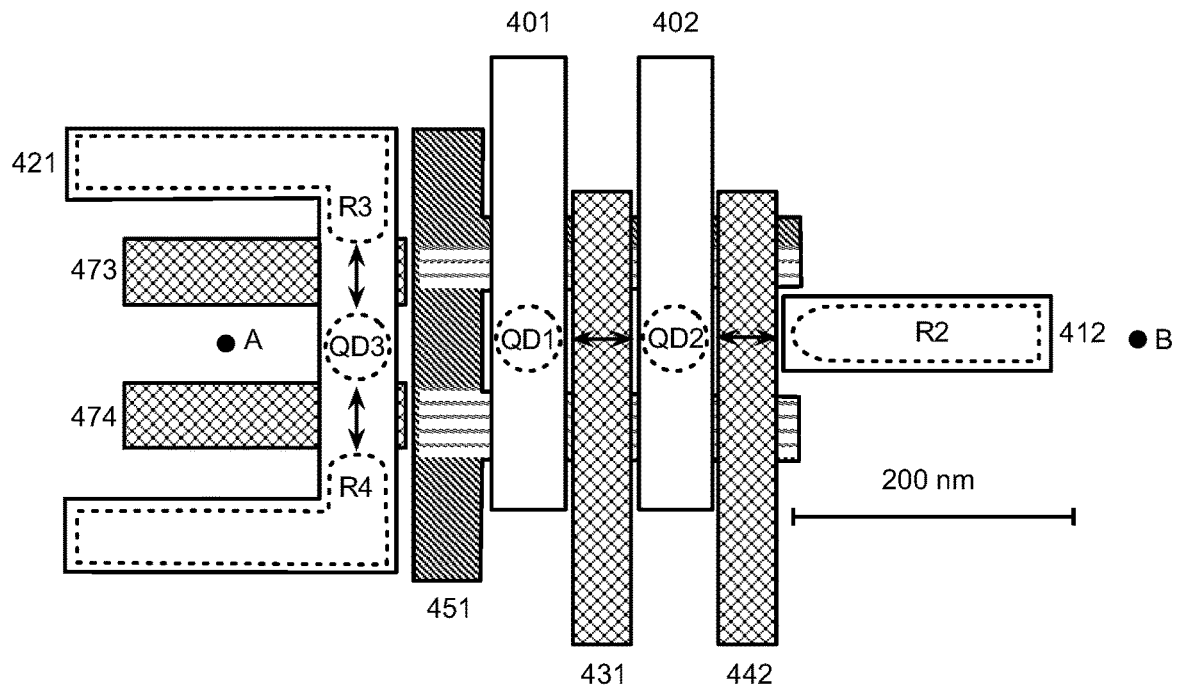
FIG. 4B is a schematic diagram showing a prior art implementation of a local accumulation design dual quantum dot.
Figure 4C:
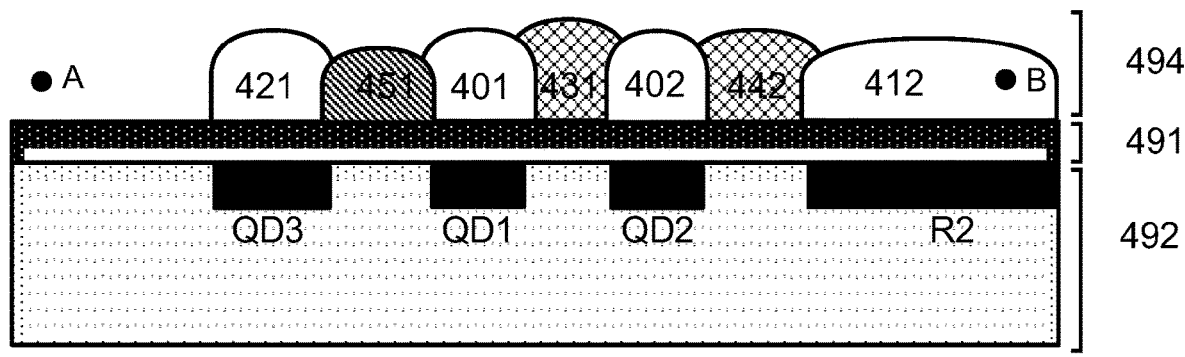
FIG. 4C is a schematic diagram showing a cross-sectional view through the layer structure of the prior art dual quantum dot implementation shown in FIG. 4B.

It will be appreciated that the embodiment of FIG. 6A provides control for the reservoir accumulation mainly via gate 611 and the QD charge occupation mainly via gate 601, and provides a simplified control over the tunnel properties in terms of number of required gates over prior art implementations, such as the one illustrated in FIG. 4A in which an additional depletion mode gate is used to control the tunnel rate, by using only gates 611 and 601 and no dedicated barrier gate to control the tunnel rate.

Figure 6B:
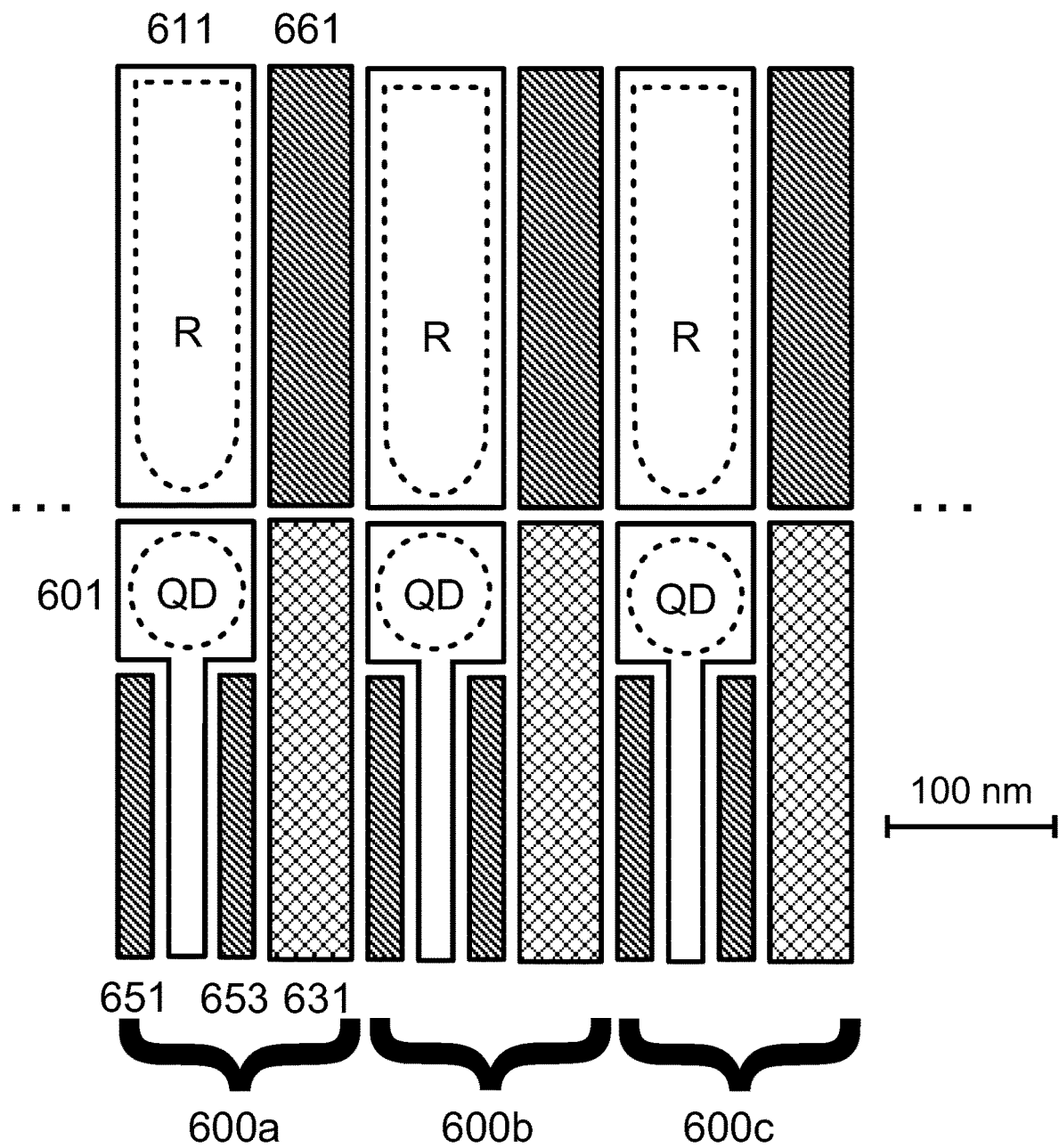
FIG. 6B is another schematic diagram illustrating a split gate quantum dot array structure in accordance with another implementation of the embodiment of the proposed solution.
Figure 6C:
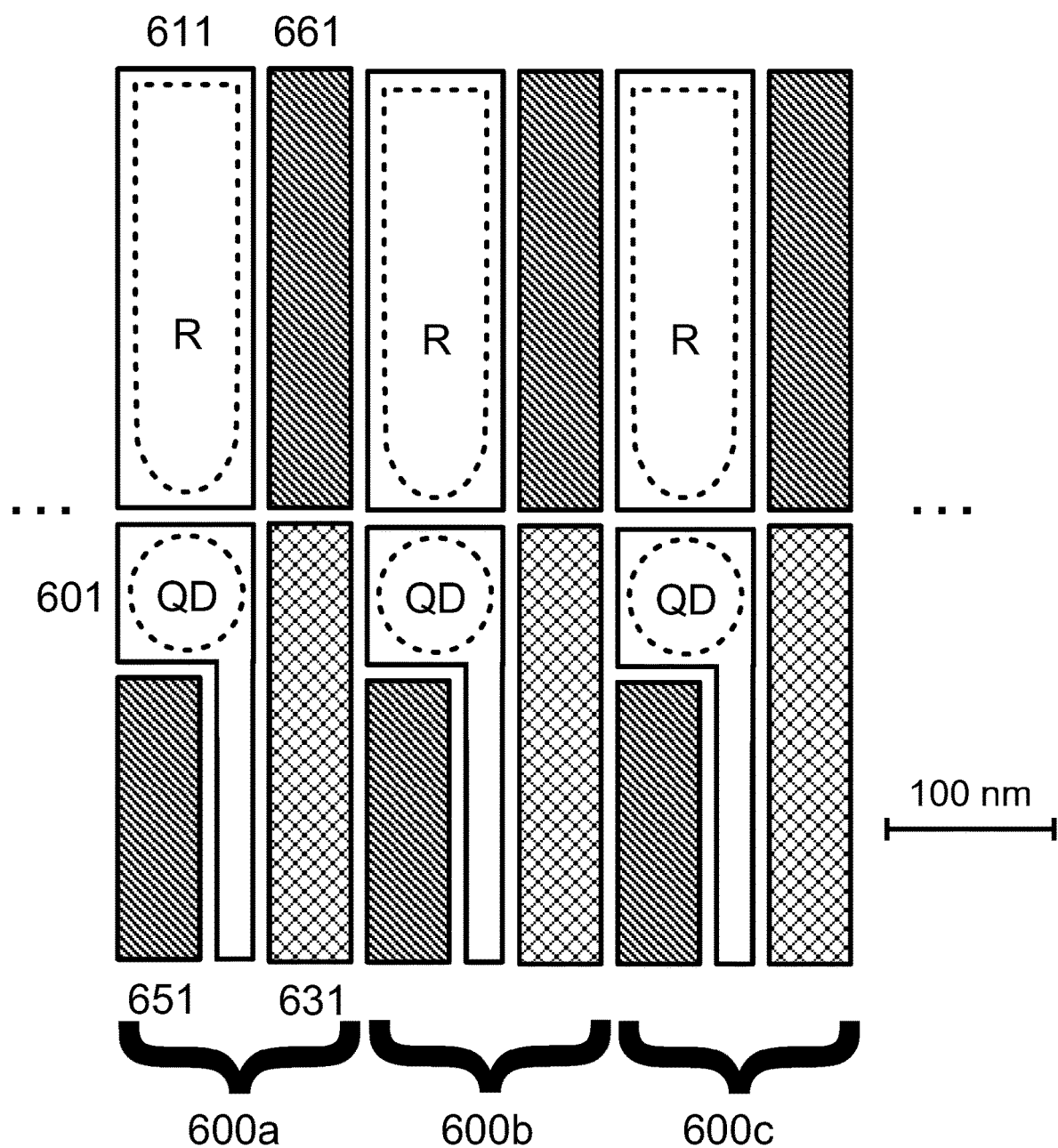
FIG. 6C is another schematic diagram illustrating a split gate quantum dot array structure in accordance with another implementation of the embodiment of the proposed solution.

The split gate geometry can be adapted for 2D wafer level fabrication techniques for example as illustrated schematically in FIG. 6B. In accordance with this implementation of the embodiment of the invention, two confinement gates 651 and 653 can be employed instead of one, to deplete the region under the arm of gate 601 when a positive voltage is applied to it. Alternatively, in accordance with another embodiment of the invention, illustrated in FIG. 6C, a single confinement gate 651 could be used. Scale bars in FIGS. 6A, 6B and 6C illustrate typical dimensions needed for the implementation of every function of a scalable quantum information processing device in a silicon substrate.

Figure 6D:
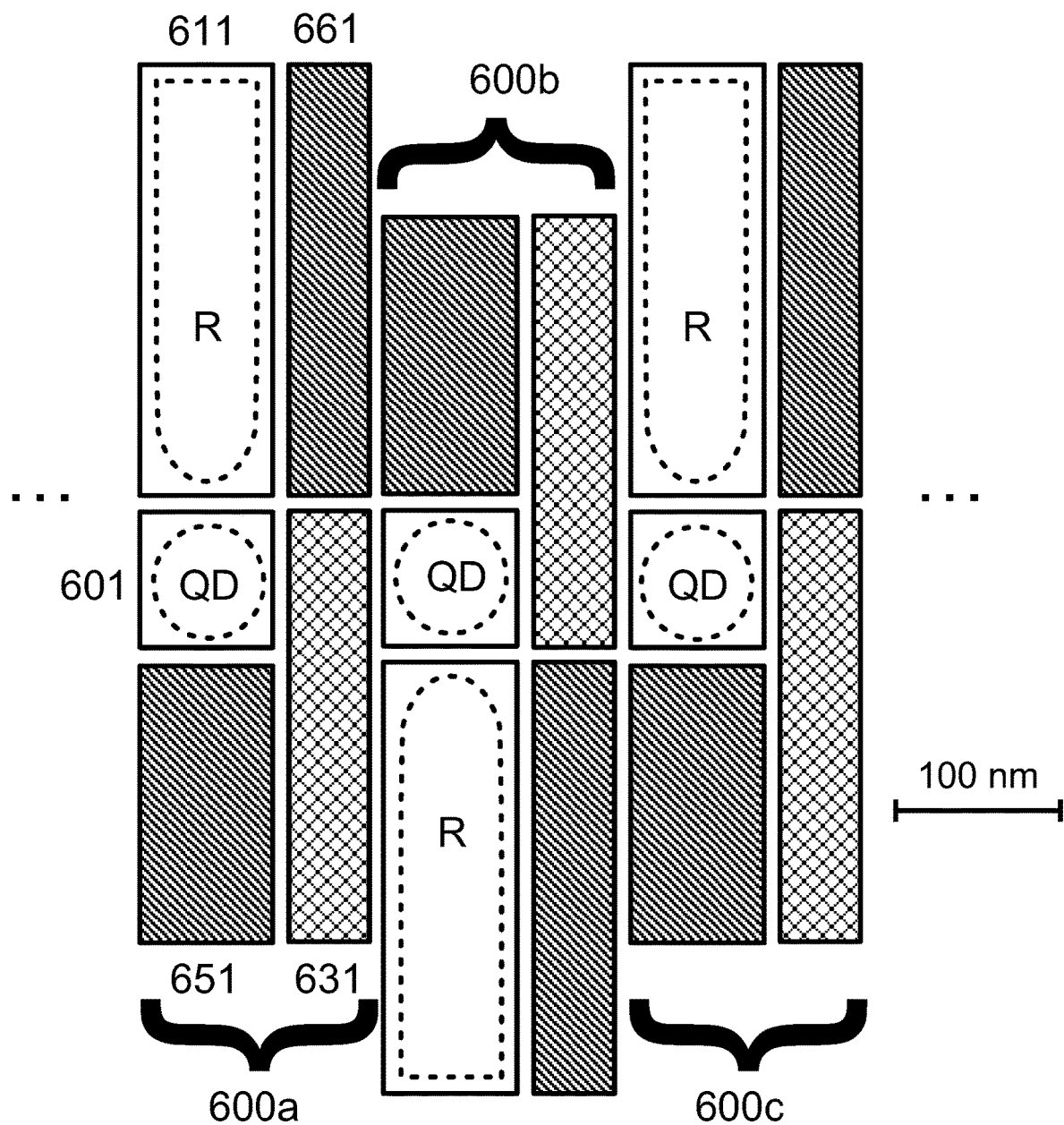
FIG. 6D is another schematic diagram illustrating a split gate quantum dot array structure in accordance with another implementation of the embodiment of the proposed solution.
Figure 6E:
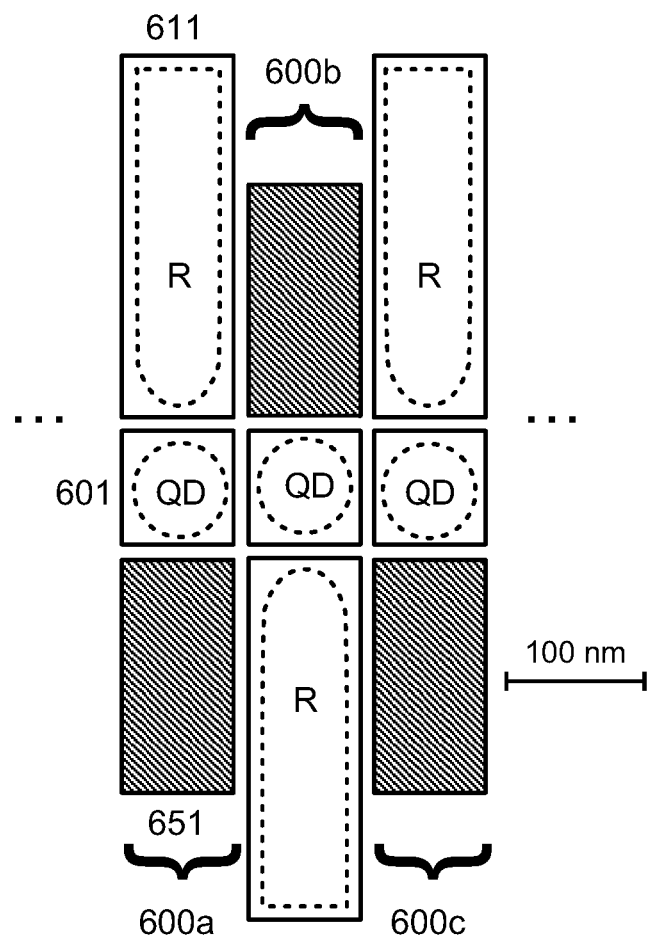
FIG. 6E is another schematic diagram illustrating a split gate quantum dot array structure in accordance with another implementation of the embodiment of the proposed solution.
Figure 6F:
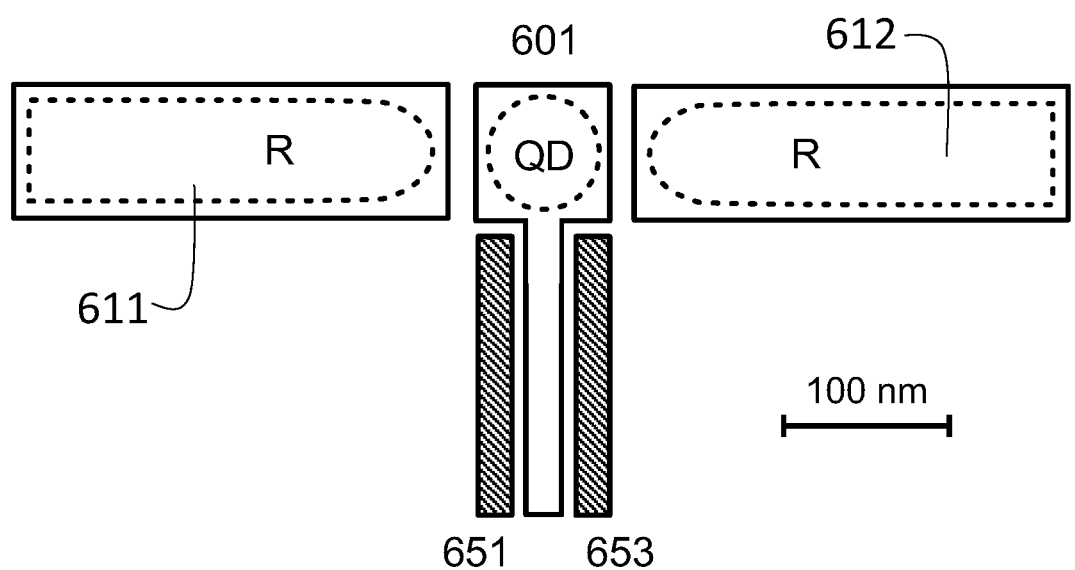
FIG. 6F is another schematic diagram illustrating a split gate quantum dot array structure in accordance with another implementation of the embodiment of the proposed solution.

The arrangement of the reservoirs R need not be on one side of the device. Alternatively, reservoirs can be arranged as desired, for example alternatingly on different sides as illustrated in FIGS. 6D and 6E. It will be appreciated that the quantum dots and reservoirs need not be arranged in a straight line but can follow different arrangements that permit controlled coupling between the qubits, whether a curved line or a staggered pattern.

Coupling gates between the quantum dots QD need not be present, as illustrated in FIG. 6E.

A second reservoir R can be added in series with the first reservoir and the quantum dot to perform transport measurements. This is illustrated in FIG. 6E, where the QD gate 601 is placed in between the reservoir gates 611 and 612 so that a current can flow across the reservoir under 611 through the QD under 601 and across the reservoir under 612. The reservoirs need not be arranged in front of one another to perform transport measurement. The arrangement of FIGS. 6A, 6B, 6C, 6D and 6E also allow transport from one reservoir to another through QDs in series with them, such as from the reservoir under 611a to the reservoir under 611b through QDs under gates 601a and 601b successively.

Figure 7B:
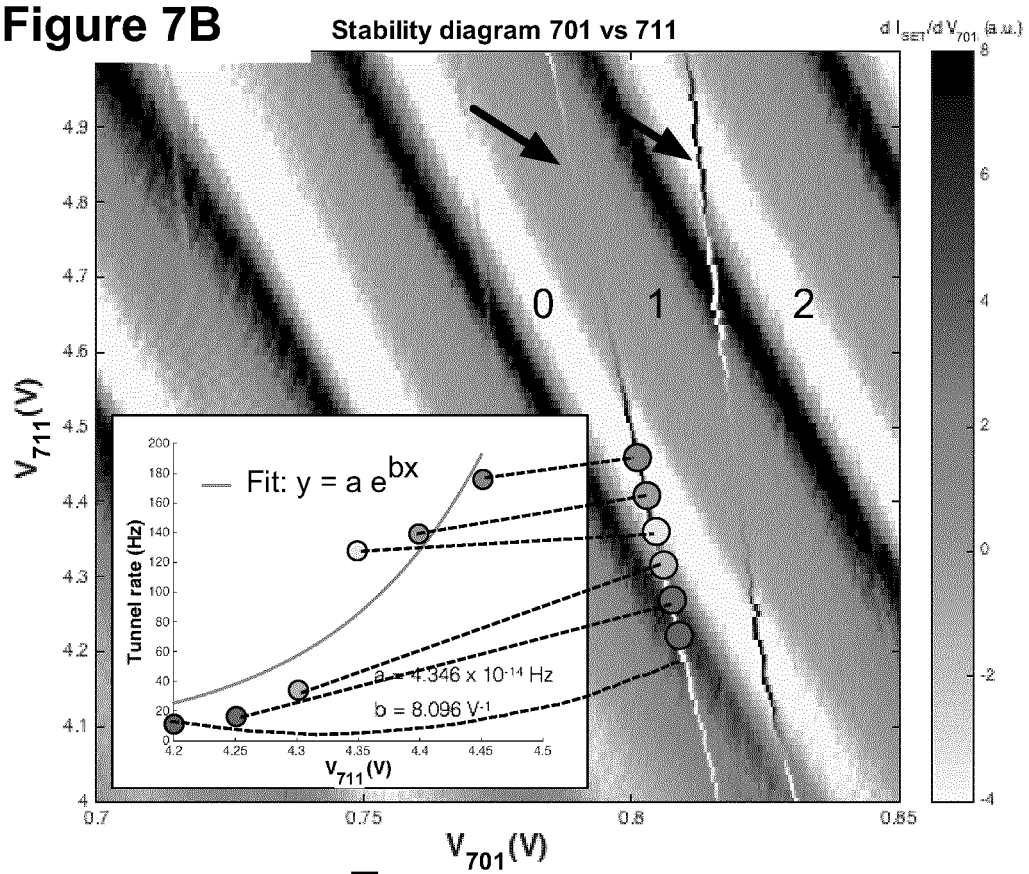
FIG. 7B is a schematic plot showing experimental data obtained in operating the quantum dot prototype in accordance with the proposed solution.
Figure 7A:
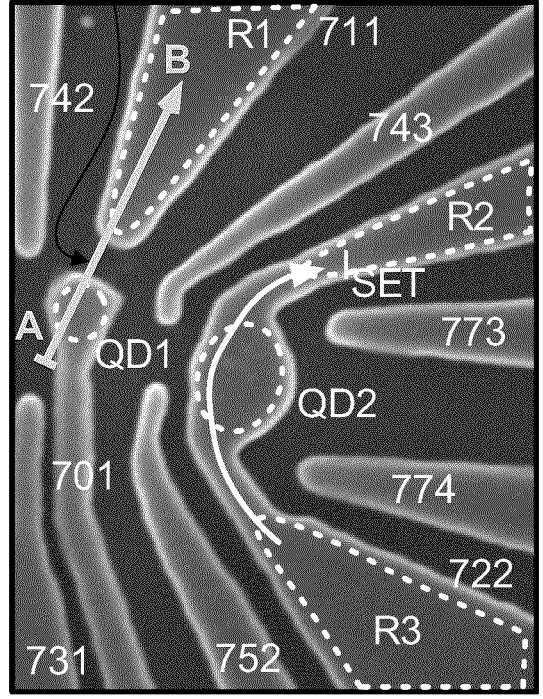
FIG. 7A is a scanning electron microscope image showing plan view of a wafer level implementation of a prototype quantum dot device in accordance with the proposed solution.

FIG. 7A illustrates a plan view of a QD structure implemented in accordance with the proposed solution demonstrating tunnel rate control, dot formation and reservoir formation with the split gate geometry. All gates are 2D wafer level manufactured of polycrystalline silicon. A positive voltage is applied on gate 711 to form the reservoirs R1 at the interface between the substrate and the dielectric layer (like layer 592 in FIG. 5B). A positive voltage is applied on gate 701 to form the quantum dot QD1 at the interface between the substrate and the dielectric layer. A positive voltage is applied to gate 722 to form the reservoirs R2 and R3 and the dot QD2 of the SET, to be used as a charge sensor. Gates 773 and 774 help to control the tunnel barriers of the SET, and are operated with negative voltages. Gates 743 and 752 enhance confinement of the SET and are operated with a negative voltage. The voltage applied on gates 731 and 742 helps confine the quantum dot QD1. The current through the SET is measured to obtain the charge state of QD1. A gap exists between gates 701 and 711. This spatial separation forms the tunnel barrier T between QD1 and R1. The axis along the arrow between points A and B is the axis of measurement for FIG. 7D.

FIG. 7B illustrates experimental data plots showing the effect of reservoir gate 711 and dot gate 701 on the tunnel rate between the reservoir R1 and the dot QD1. In this stability diagram, gates 701 and 711 are swept through control potentials to navigate the charge states of QD1, and the current through the SET is measured. Charge states are indicated as (N), where N is the number of electrons in QD1. Taking the derivative of the SET current as a function of gate 701 voltage, transitions become visible. Those transitions are designated by arrows and correspond to transitions in the number of electrons in QD1. Inset shows the measured tunnel rate as a function of gate 711 voltage for the colored points on the transition in the background stability diagram. The voltage on gate 701 is also slightly different for each data point, as increasing the voltage on gate 711 moves the dot energy states, and this must be compensated with a diminution of the voltage on gate 701 to keep the number of electrons constant in the quantum dot. Data in the inset indicates an increase in tunnel rate as a function of gate 711 control voltage.

Figure 7C:
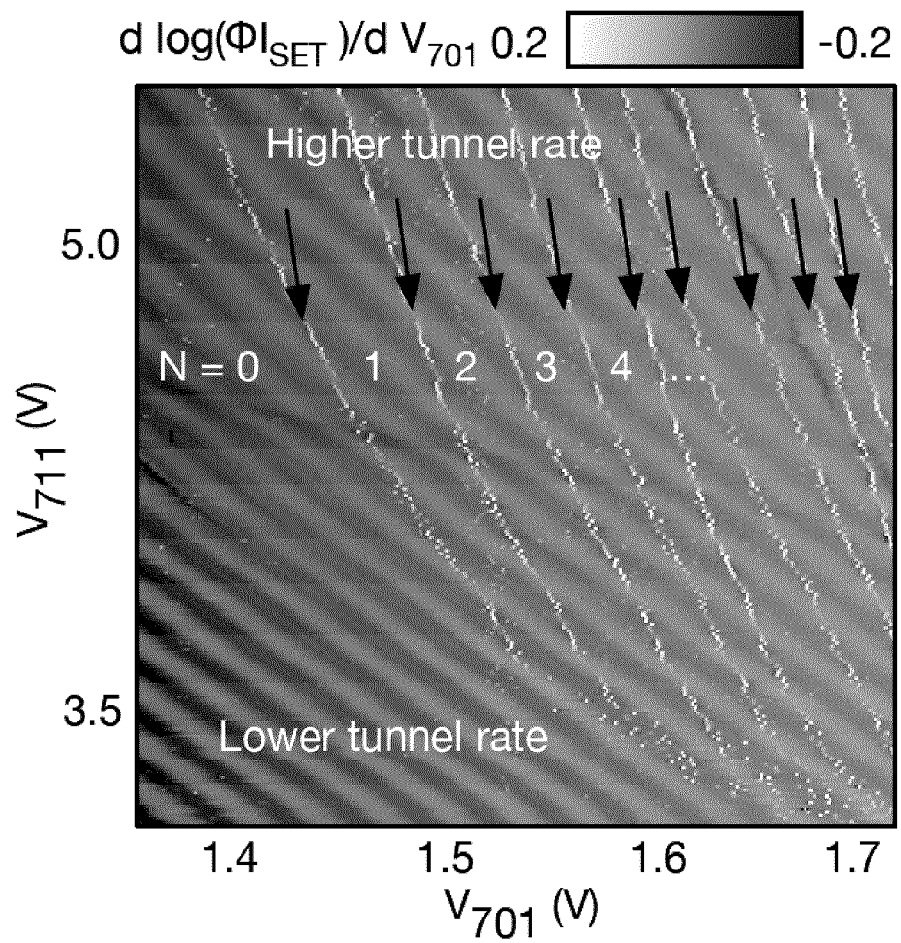
FIG. 7C is a schematic plot showing experimental data obtained in operating the quantum dot prototype in accordance with the proposed solution.

FIG. 7C illustrates an experimental data plot demonstrating a technique for efficient charge initialization in a quantum dot using the proposed solution. In this stability diagram, gates 701 and 711 are swept through control potentials to navigate the charge states of QD1, and the current through the SET is measured. Charge states are indicated as (N), where N is the number of electrons in QD1. Transitions corresponding to transitions in the number of electrons in QD1 are designated by arrows. The region N=0 is identified by the absence of further transitions in the signal. In prior art implementations, where a split gate geometry is not used to control the tunnel rate between the dot and the reservoir, the identification of the N=0 region is complicated by the fact that further transitions might not be visible because of a too low tunnel rate. In accordance with the proposed solution, sweeping only gates 701 and 711 allows to scan the entire parameter space, going from a lower tunnel rate region to a higher tunnel rate region in a single scan. This principle is demonstrated experimentally in FIG. 7B. This technique is useful to detect the last transition with a single stability diagram, as even if it is not visible in a lower tunnel rate region, it will become apparent in the higher tunnel rate region of the stability diagram.

Figure 7D:
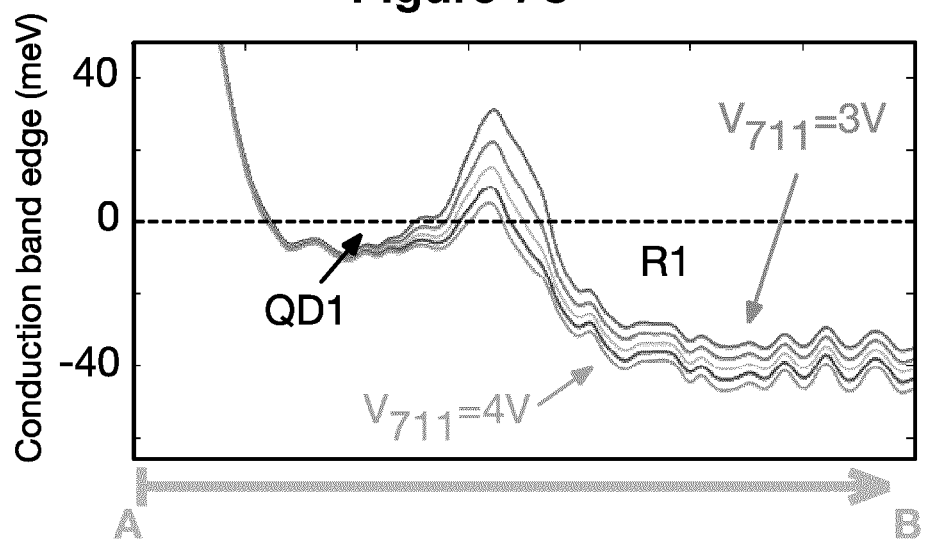
FIG. 7D is a schematic plot showing numerical simulations data obtained in simulating the operation of the quantum dot prototype in accordance with the proposed solution.

FIG. 7D illustrates numerical simulation data obtained in simulating the operation of the quantum dot prototype in accordance with the proposed solution. The conduction band edge along the AB axis shown in FIG. 7A is obtained at increasing reservoir gate 711 voltages, from 3 to 4 V, with 0.25 V increments. The simulations show that increase of the gate 711 voltage lowers the tunnel barrier height and reduces its width. This is consistent with the observed associated increase in tunnel rate for experimental data as in FIG. 7C.

Figure 7E:
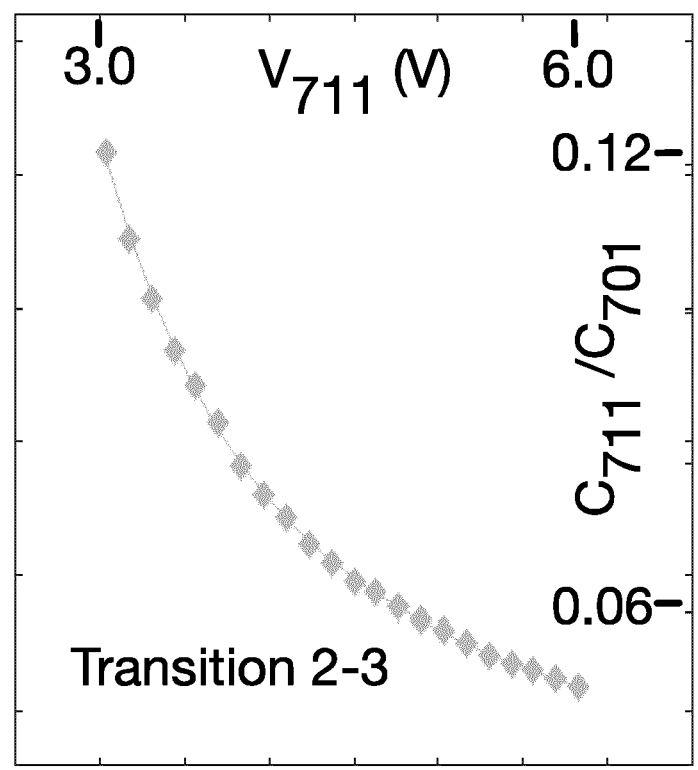
FIG. 7E is a schematic plot showing experimental data obtained in operating the quantum dot prototype in accordance with the proposed solution.

FIG. 7E shows an experimental data plot obtained from mathematical treatment of the stability diagram of FIG. 7C. Data points correspond to the calculated gate to dot capacitance ratio of gates 711 and 701, as a function of the voltage applied to gate 711, for the transition between regions 2 and 3 of FIG. 7C. The curve is a fit to the data points, and is approximately exponential. FIG. 7E shows that the gate to dot capacitance ratio for gates 711 and 701 diminishes with increased gate 711 voltage. This indicates that the gate 711 becomes less and less efficient at displacing the dot energy level as its voltage is increased.

In accordance with the proposed solution, formation of a reservoir and a quantum dot and control of tunneling rate between them is provided with a minimal gate count and a single gate stack. This simplification in gate architecture is advantageous for scalability. From an operational perspective, the proposed solution facilitates the control, readout and initialization of multiple quantum dots charge states, since it's possible to attach a reservoir to each dot in a 1D quantum dot array. Furthermore, the proposed solution was demonstrated in a device fabricated by an entirely CMOS compatible process, using a single stack of polysilicon gates and substractive lithography processes.

Quantum Processing Unit

Multiple Quantum Dot (QD) structures proposed herein can be used in providing algorithmic and/or logical calculations in a quantum computing unit of a central processing unit. Examples of integration of essential functionalities for quantum computation to QD array structures implemented with the split gate geometry are provided. Those functionalities include (i) charge sensing, (ii) charge initialization, (iii) single spin rotations, and (iv) exchange coupling.

For simplicity, ancillary electronic components providing: memory storage such as random access memory storage, input data registers, input address registers, output data registers, output address registers, latches, etc. are not illustrated.

In accordance with the proposed solution, FIG. 8 illustrates the architecture of an implementation in which capacitive charge sensing is employed in a QD array structure illustrated in FIG. 6B. In this implementation, confinement gate 853a from unit cell 800a is connected to an inductance L and to a radio-frequency source RF-in. Changes in the occupation number of the associated QD modify the capacitance between 853a gate and the QD. This affects the resonance frequency of the RLC resonator, and thus the reflected signal RF-out. Each QD in the array can employ a corresponding charge detection circuit for improved sensitivity. Without limiting the invention, in alternate variant implementations the charge detection circuit could also be integrated to gate 811 or 851. Other implementations could include different readout circuits sensitive to the change in the occupation number of the QDs through their capacitance to field-effect-transistors (FET) or capacitive bridges (see U.S. Pat. Nos. 5,889,288 and 7,830,695). Alternatively, other proximal charge sensors such as single electron transistors can also be included in a quantum dot array in accordance with the proposed solution, as evident with the prototype presented in FIG. 7A.

In accordance with the proposed solution, charge initialization of a quantum dot is obtained by sweeping through control potentials for the reservoir accumulation gate (like gate 811a in FIG. 8) and the quantum dot accumulation gate (like gate 801a in FIG. 8). The transition indicative of the last electron leaving/entering the quantum dot in the resulting stability diagram is straigthforward to identify with the split gate geometry. This is due to the tuning of the tunnel rate, dot occupation, and reservoir density as the two accumulation gates are swept. The last transition will inevitably become apparent when the tunnel rate is high enough, event if it is not visible in a given regime. In an arrayed chain of quantum dots in accordance with the proposed solution, such a procedure is available to each quantum dot in the array.

Figure 9A:
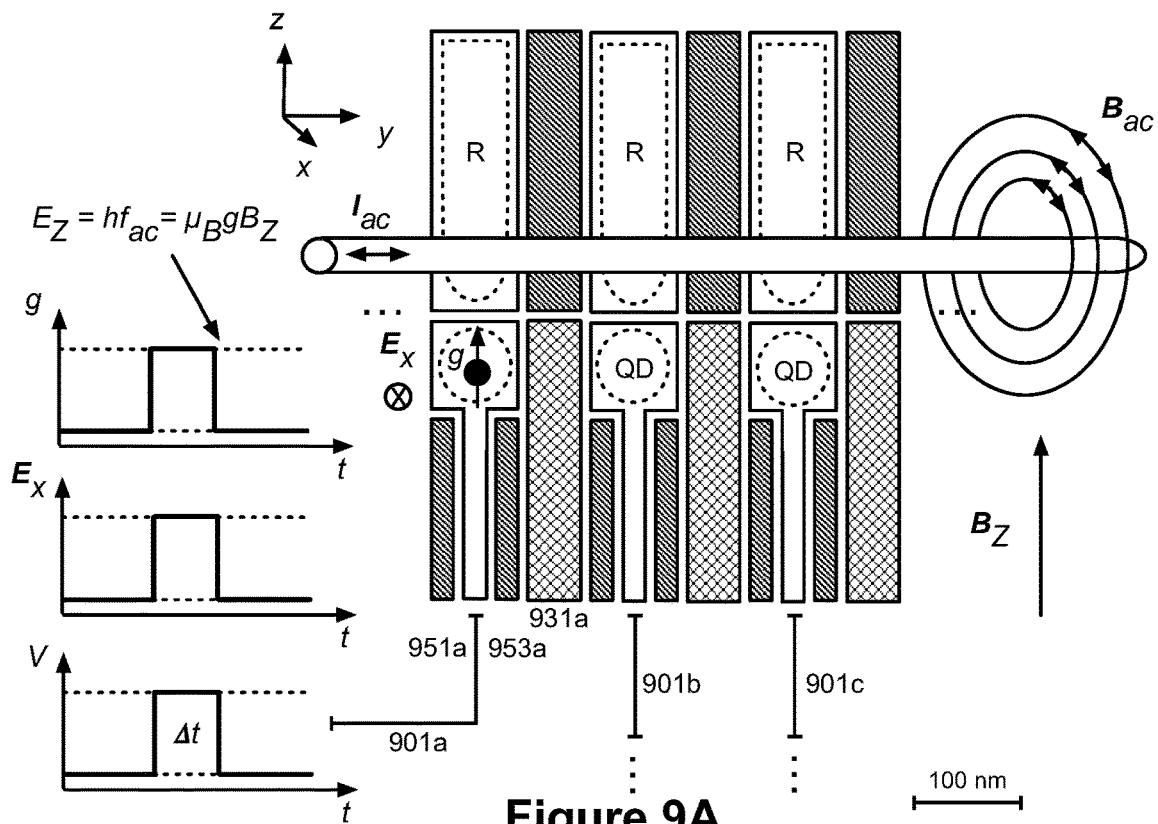
FIG. 9A is a schematic diagram illustrating electron spin rotation of electrons trapped in the quantum dot array in accordance with an implementation of the embodiment of the proposed solution illustrated in FIG. 6B, by the ESR method.

In accordance with the proposed solution, FIG. 9A schematically illustrates functional details of an implementation employing ESR for addressable single electron spin rotations employed in a QD array structure illustrated in FIG. 6B. An oscillating current $I_{ac}$ is forced through a high-frequency antenna, producing an oscillating magnetic field $B_{ac}$ having a frequency $f_{ac}$. A property referred to as the Zeeman energy $E_Z$ of the electron spin in the QD under gate 901a is initially off-resonance with $B_{ac}$. The transverse electric field $E_x$ can be controlled by applying a pulse of voltage V on the accumulation gate 901a, which affects the g-factor g of the electron, bringing $E_Z$ into resonance with $f_{ac}$. Other QDs in the array will not be brought into resonance by this procedure applied to the gate 901a. The duration $\Delta t$ of the pulse determines the amplitude of the spin rotation, while its phase determines the angle of rotation on the Bloch sphere. Every qubit in the chain (QD array) can be individually addressed by connecting each 901 gate to a corresponding pulsing circuit.

Figure 9B:
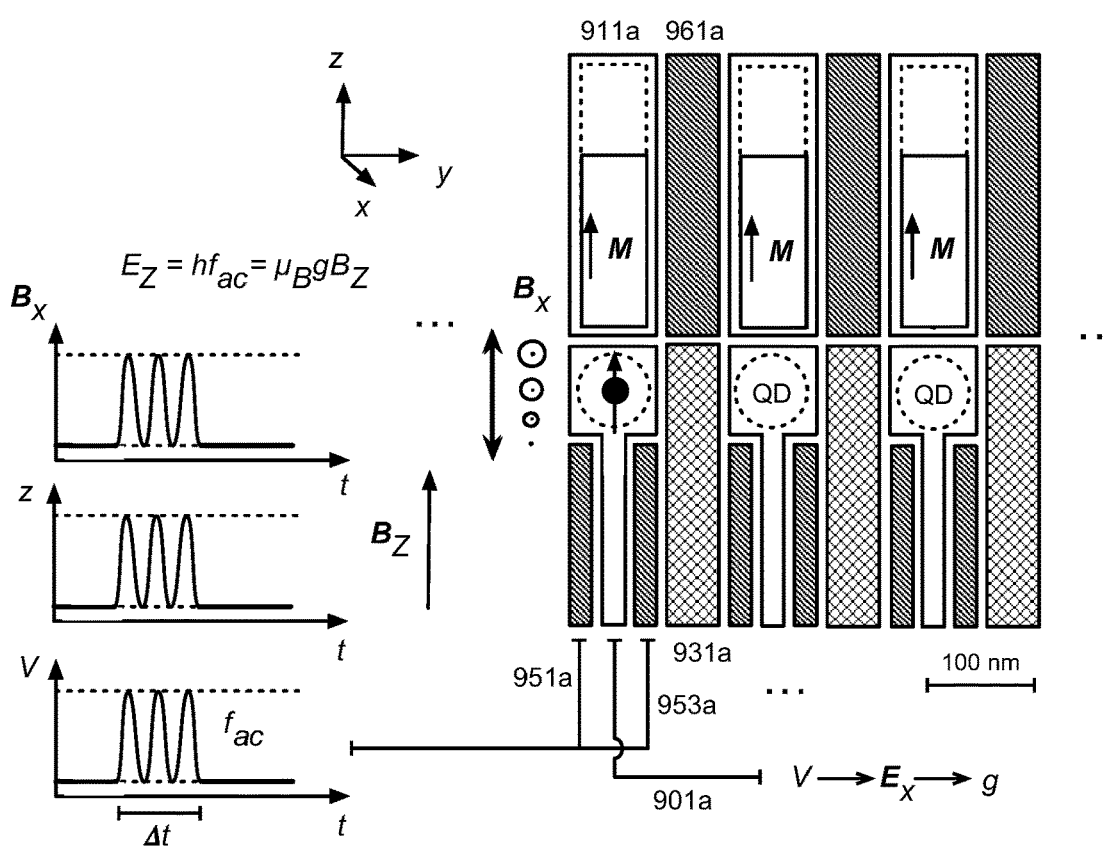
FIG. 9B is a schematic diagram illustrating electron spin rotation of electrons trapped in the quantum dot array in accordance with an implementation of the embodiment of the proposed solution illustrated in FIG. 6B, by the EDSR method.

In accordance with the proposed solution, FIG. 9B schematically illustrates functional details of another implementation employing Electron Dipole Spin Resonance (EDSR) for addressable single electron spin rotations employed in a QD array structure illustrated in FIG. 6B. An asymmetrical strip of ferromagnetic material with magnetization M, positioned on top of gate 911 for each qubit cell, provides an inhomogeneous transverse magnetic field $B_x$ for each QD. The external magnetic field component $B_z$ sets the Zeeman energies $E_Z$ of the QDs. An AC pulse of voltage V and frequency $f_{ac}$, in resonance with $E_Z$ of the addressed electron is applied to gate 951 and/or 953 of the corresponding unit cell to oscillate the electron's position in the QD. In combination with the transverse magnetic field produced by the ferromagnetic strip which also has an inhomogeneous component $B_x$, applying the AC pulse produces an effective oscillating magnetic field $B_{ac}$ in resonance with $E_Z$. The g-factor of each trapped electron in the chain can be individually tuned using its gate 901, which ensures a dot-specific Zeeman energy. Consequently, other QDs in the array will not be brought into resonance by the pulse applied to the confinement gates of the addressed electron. The duration $\Delta t$ of the pulse determines the amplitude of the spin rotation, while its phase determines the angle of rotation on the Bloch.

While not explicitly illustrated in FIGS. 8, 9A and 9B, the person skilled in the art will understand that the semiconductor device further comprises control circuitry connected to the reservoir accumulation gate and the quantum dot accumulation gate for applying to the reservoir gate and the quantum dot gate a common polarity electrical potential to defines the tunnel barrier height, width and charge tunneling rate between the quantum dot well and the electric charge reservoir without relying on any barrier gate to control the charge tunneling rate. Such circuitry can also control voltages applied to the gates for setting charges in the quantum dot reservoirs, control charge movements, and/or control spin state setting and readout.

The control circuitry can comprise but is not limited to: voltage sources, current monitors, voltage-to-current converters, attenuators, amplifiers, bias-tee to combine AC and DC signals, high frequency (radio-frequency and microwave) sources, pulse generators, lock-in amplifiers, RLC circuits, filters. The control circuitry can either be connected externally to the quantum dot device, in a similar fashion to what is described in the article titled "An addressable quantum dot qubit with fault-tolerant control fidelity" by Veldhorst et al. and published in Nature Nanotechnology 9, 981 (2014), or it could be integrated, in parts or in its entirety, directly to the quantum dot structure to form a single device, following proposals in the article titled "Silicon CMOS architecture for a spin-based quantum computer" by M. Veldhorst et al., arXiv:1609.09700 (2016) and in the article titled "Interfacing spin qubits in quantum dots and donors—hot, dense and coherent" by L. M. K. Vandersypen et al., arXiv:1612.05936 (2016).

Figure 10A:
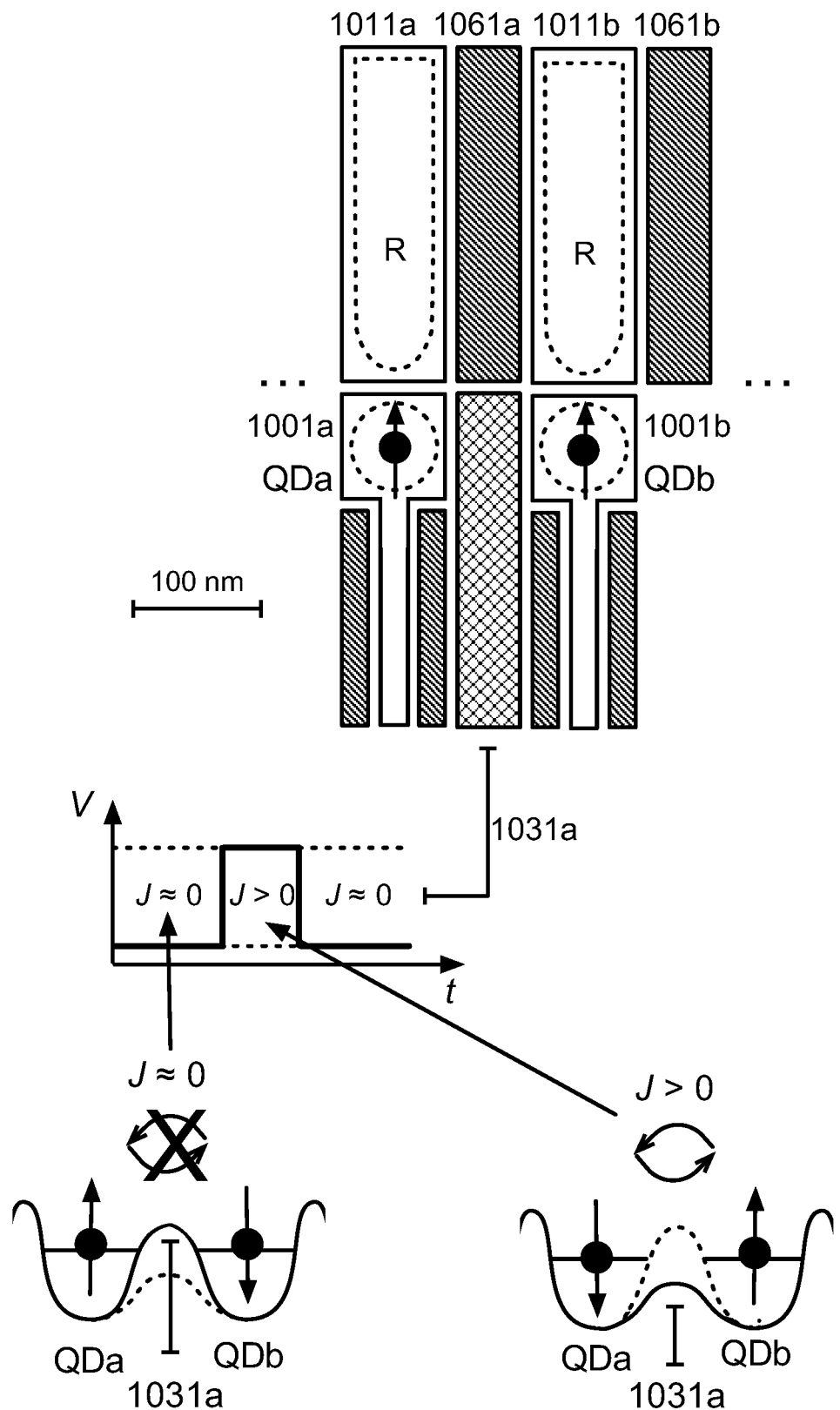
FIG. 10A is a schematic diagram illustrating coupling by exchange interaction of electrons trapped in the quantum dot array in accordance with an implementation of the embodiment of the proposed solution illustrated in FIG. 6B, using tuning of the barrier.
Figure 10B:
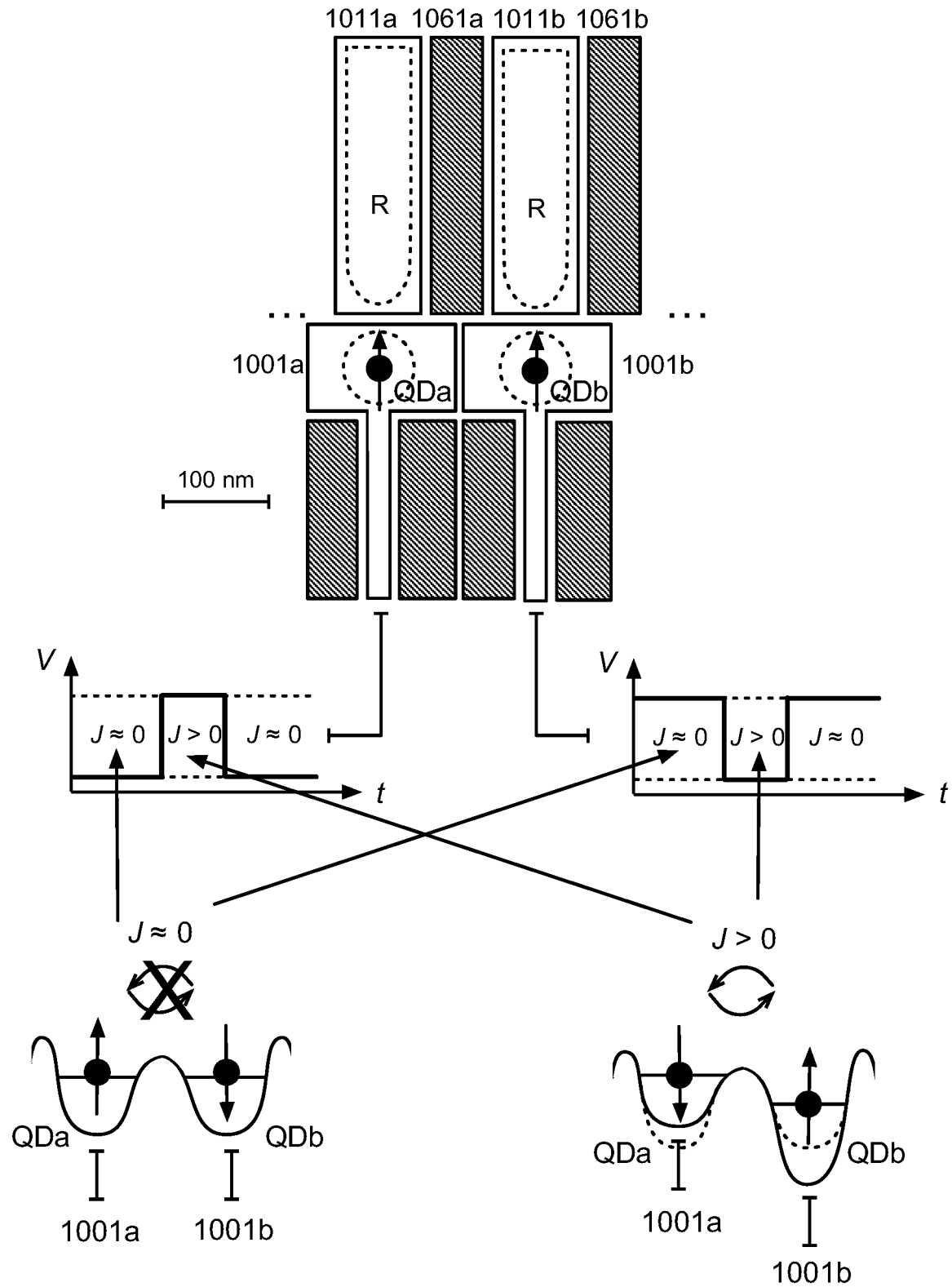
FIG. 10B is a schematic diagram illustrating coupling by exchange interaction of electrons trapped in the quantum dot array in accordance with a modification of the implementation of the embodiment of the proposed solution illustrated in FIG. 6B, using detuning between the dots.
Figure 10C:
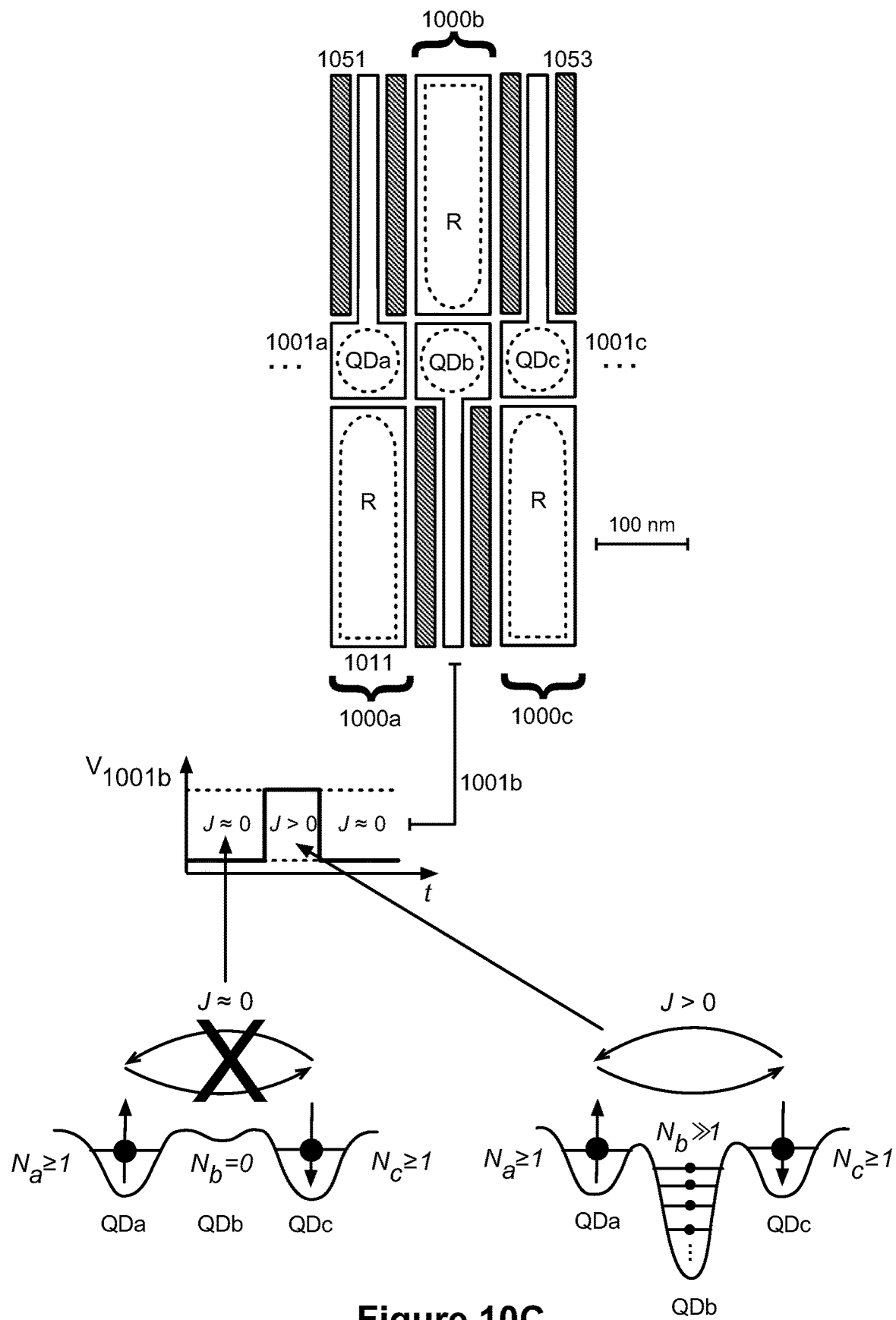
FIG. 10C is a schematic diagram illustrating coupling by exchange interaction of electrons trapped in the quantum dot array in accordance with a modification of the implementation of the embodiment of the proposed solution illustrated in FIG. 6E, using a dot as a coupler.

In accordance with the proposed solution, FIG. 10A illustrates the architecture of an implementation in which exchange coupling is employed in a QD array structure illustrated in FIG. 6B. The coupling between two neighboring electrons formed under gates 1001a and 1001b is provided by switching on the exchange interaction J by increasing the voltage V applied on barrier gate 1031a. Increasing the voltage V on gate 1031a lowers the tunnel barrier between the two dots QDa and QDb, as illustrated in the schematic associated with the J>0 region of the V versus t graph. The schematic shows the energy minima of the conduction band along the two adjacent quantum dots when the dot accumulation gates 1001a and 1001b are activated with a positive voltage. The horizontal dimension is spatial while the vertical dimension is representative of the conduction band energy. Both quantum dots contain a single electron occupying the discrete energy levels represented by horizontal lines. The arrows indicate the direction of the spin. By increasing the voltage on barrier gate 1031a during a finite time interval, the tunnel barrier is lowered, allowing for coupling to occur. As illustrated in the schematic associated with the J=0 region of the V versus t graph, the exchange coupling is turned off by increasing the tunnel barrier energy, which is done by lowering the voltage V applied on gate 1031a. Alternately, the exchange interaction J could be turned on and off by modulating the energy difference between Qda and QDb (the detuning) with voltages applied to gates 1001a and 1001b, as represented in FIG. 10B. In this implementation, tunnel barrier gate 1031a is removed, since by setting the spatial gap between gates 1001a and 1001b to a determined value, exchange coupling can be realized only via detuning with gates 1001a and 1001b. In another version, the exchange interaction J could be modulated by the number of electrons present in a coupling quantum dot between the two quantum dots of interest, as represented in FIG. 10B. In this implementation, there is no need for tunnel barrier gates between the quantum dots. The exchange interaction J between QDa and QDc is turned on and off by the presence or absence of electrons in QDb, respectively. The number of electrons in QDb is tuned by the voltage on gate 1001b. Electrons can be loaded or unloaded to QDb directly through reservoir Rb under gate 1011b.

The proposed solution can be applied to: solving problems intractable to solve via classical computing such as simulation of physical models (weather prediction, molecular structures, etc.); cryptography; secure communications; etc. Such application would be of interest at least to: scientific research; pharmaceutics; banking; space exploration; government agencies (agricultural, security, emergency response, population planning, etc.)

For certainty, process steps presented herein are understood to be employed in either in sequence or in parallel and not limited to the sequence described above.

While the invention has been shown and described with reference to preferred embodiments thereof, it will be recognized by those skilled in the art that various changes in form and detail may be made therein without departing from the spirit and scope of the invention as defined by the appended claims.

What is claimed is:

1. A semiconductor device for use in a quantum computer, the device comprising:
   a reservoir accumulation gate defining an electric charge reservoir in a semiconductor substrate;
   a quantum dot accumulation gate defining a quantum dot well in the semiconductor substrate;
   a gap between said reservoir accumulation gate and said quantum dot accumulation gate;
   wherein said gap is not filled with any physical structure providing a tunnel barrier between said electric charge reservoir and said quantum dot well, and a common polarity electrical potential applied to said reservoir gate and said quantum dot gate defines a tunnel barrier height, width and charge tunneling rate between said quantum dot well and said electric charge reservoir without relying on any barrier gate to control the charge tunneling rate.

2. The device as defined in claim 1, further comprising:
   an array of control gates arranged near said reservoir gates and said quantum dot gates, an electrical potential applied to said control gates able to confine electrons within said quantum dot wells and said electron reservoirs.

3. The device as defined in claim 1, wherein said device is a Complementary Metal-Oxide-Semiconductor (CMOS) device.

4. The device as defined in claim 3, wherein said devices is made using 3D wafer level fabrication techniques.

5. The device as defined in claim 3, wherein said devices is made using 2D wafer level fabrication techniques.

6. The device as defined in claim 3, wherein said device comprises silicon 28 isotope enriched silicon substrate material.

7. The device as defined in claim 1, further comprising control circuitry connected to said reservoir accumulation gate and said quantum dot accumulation gate for applying to said reservoir gate and said quantum dot gate a common polarity electrical potential to define said tunnel barrier height, width and charge tunneling rate between said quantum dot well and said electric charge reservoir without relying on any barrier gate to control the charge tunneling rate.

8. A semiconductor device for use in a quantum computer, the device comprising an arrangement of quantum dots and their related control structures, the device comprising:
an array of reservoir accumulation gates defining electric charge reservoirs;
an array of quantum dot accumulation gates defining quantum dot wells with each one of said quantum dot gates arranged next to one end of a corresponding one of said reservoir gates with a gap therebetween, wherein said gap is not filled with any physical structure providing a tunnel barrier, a common polarity electrical potential applied to said reservoir gates and said quantum dot gates defining a tunnel barrier height, width and charge tunneling rate between a respective one of said quantum dot wells and said electric charge reservoirs without relying on any barrier gate to control the charge tunneling rate; and
an array of barrier gates, an electrical potential applied to said barrier gates able to control charge spin coupling between charges trapped in said quantum dot wells.

9. The device as defined in claim 8, wherein said array of quantum dot gates provides a straight row of said quantum dot wells.

10. The device as defined in claim 8, wherein said device is a Complementary Metal-Oxide-Semiconductor (CMOS) device.

11. The device as defined in claim 10, wherein said devices is made using 3D wafer level fabrication techniques.

12. The device as defined in claim 10, wherein said devices is made using 2D wafer level fabrication techniques.

13. The device as defined in claim 10, wherein said device comprises silicon 28 isotope enriched silicon substrate material.

14. The device as defined in claim 8, further comprising control circuitry connected to said array of reservoir accumulation gates and said array of quantum dot accumulation gates for applying to said reservoir gates and said quantum dot gates a common polarity electrical potential to define said tunnel barrier height, width and charge tunneling rate between a respective one of said quantum dot wells and said electric charge reservoirs without relying on any barrier gate to control the charge tunneling rate.

15. A method of transferring charges between an electric charge reservoir and a quantum dot in a semiconductor device for use in a quantum computer, the method comprising:
providing a gap between a reservoir accumulation gate and a quantum dot accumulation gate in a semiconductor substrate, wherein said gap is not filled with any physical structure providing a tunnel barrier;
applying a common polarity electrical potential to each of said reservoir gate and said quantum dot gate to create a tunnel barrier between a quantum dot well and an electric charge reservoir in said semiconductor substrate
adjusting the electrical potential to at least one of said reservoir gate and said quantum dot gate to adjust a tunnel barrier height, width and charge tunneling rate between said quantum dot well and said electric charge reservoir without relying on any barrier gate to control the charge tunneling rate;
said adjusting being done while detecting a number of charges in the quantum dot well or charge flow between the quantum dot well and the electric charge reservoir in said semiconductor substrate so as to provide in said quantum dot well a predetermined number of electric charges.

16. The method as defined in claim 15, wherein a positive electrical potential is applied to each of said reservoir gate and said quantum dot gate, said predetermined number of electric charges being a number of electrons.

17. The method as defined in claim 16, wherein said number of electrons is a single electron.

18. The method as defined in claim 15, wherein said semiconductor device is for use in a quantum computer, the semiconductor device comprising:
the reservoir accumulation gate defining the electric charge reservoir in the semiconductor substrate;
the quantum dot accumulation gate defining the quantum dot well in the semiconductor substrate.

19. The method as defined in claim 15, wherein said semiconductor device is for use in a quantum computer, the semiconductor device comprising an arrangement of quantum dots and their related control structures, the device comprising:
an array of reservoir accumulation gates defining electric charge reservoirs;
an array of quantum dot accumulation gates defining quantum dot wells with each one of said quantum dot gates arranged next to one end of a corresponding one of said reservoir gates with a gap therebetween, wherein said gap is not filled with any physical structure providing a tunnel barrier, a common polarity electrical potential applied to said reservoir gates and said quantum dot gates defining a tunnel barrier height, width and charge tunneling rate between a respective one of said quantum dot wells and said electric charge reservoirs without relying on any barrier gate to control the charge tunneling rate; and
an array of barrier gates, an electrical potential applied to said array of barrier gates able to control charge spin coupling between charges trapped in said quantum dot wells.

* * * * *

UNITED STATES PATENT AND TRADEMARK OFFICE
CERTIFICATE OF CORRECTION

PATENT NO. : 10,929,769 B2
APPLICATION NO. : 16/094176
DATED : February 23, 2021
INVENTOR(S) : Pioro-Ladriere et al.

It is certified that error appears in the above-identified patent and that said Letters Patent is hereby corrected as shown below:

In the Specification

1. In Column 2, Line 35, delete "an" and insert -- a --, therefor.

2. In Column 4, Line 34, delete "1." and insert -- 1; --, therefor.

3. In Column 5, Line 45, delete "solution." and insert -- solution; --, therefor.

4. In Column 5, Line 48, delete "solution." and insert -- solution; --, therefor.

5. In Column 5, Line 61, delete "solution." and insert -- solution; --, therefor.

6. In Column 6, Line 32, after "orientation" insert -- . --.

7. In Column 10, Line 29, delete "straigthforward" and insert -- straightforward --, therefor.

8. In Column 10, Line 33, delete "event" and insert -- even --, therefor.

In the Claims

9. In Column 12, Claim 4, Line 66, delete "devices" and insert -- device --, therefor.

10. In Column 13, Claim 5, Line 1, delete "devices" and insert -- device --, therefor.

11. In Column 13, Claim 11, Line 41, delete "devices" and insert -- device --, therefor.

12. In Column 13, Claim 12, Line 43, delete "devices" and insert -- device --, therefor.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*